US012787630B2

(12) United States Patent
Cho et al.

(10) Patent No.: US 12,787,630 B2
(45) Date of Patent: Nov. 3, 2026

(54) APPARATUS AND METHOD FOR MANUFACTURING DISPLAY DEVICE

(71) Applicant: Samsung Display Co., Ltd., Yongin-si (KR)

(72) Inventors: Youngsun Cho, Yongin-si (KR); Jaemin Hong, Yongin-si (KR); Myungkyu Kim, Yongin-si (KR); Jangwoo Kim, Yongin-si (KR); Jongsung Park, Yongin-si (KR); Sangshin Lee, Yongin-si (KR); Jungseob Lee, Yongin-si (KR); Kyunghoon Chung, Yongin-si (KR); Eunjoung Jung, Yongin-si (KR); Kyongho Hong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 745 days.

(21) Appl. No.: 18/142,479

(22) Filed: May 2, 2023

(65) Prior Publication Data

US 2023/0363245 A1 Nov. 9, 2023

(30) Foreign Application Priority Data

May 3, 2022 (KR) ........................ 10-2022-0055020

(51) Int. Cl.
*H10K 71/16* (2023.01)
*C23C 14/04* (2006.01)
(Continued)

(52) U.S. Cl.
CPC ......... *H10K 71/166* (2023.02); *C23C 14/042* (2013.01); *C23C 14/24* (2013.01); *H10K 59/1201* (2023.02)

(58) Field of Classification Search
CPC .. H10K 71/166; H10K 59/1201; H10K 71/16; H10K 71/70; H10K 71/00;
(Continued)

(56) References Cited

U.S. PATENT DOCUMENTS

| | | | | |
|---|---|---|---|---|
| 9,450,140 | B2 | 9/2016 | Jo et al. | |
| 2010/0227060 | A1* | 9/2010 | Na | C30B 25/165 427/255.28 |

(Continued)

FOREIGN PATENT DOCUMENTS

| | | |
|---|---|---|
| JP | 2006-322015 | 11/2006 |
| KR | 10-0696553 B1 | 3/2007 |

(Continued)

OTHER PUBLICATIONS

Extended European Search Report issued in corresponding EP Application No. 23171170.6, dated Oct. 9, 2023, 7 pages.

*Primary Examiner* — Ermias T Woldegeorgis
(74) *Attorney, Agent, or Firm* — Womble Bond Dickinson (US) LLP

(57) ABSTRACT

An apparatus for manufacturing a display device includes: a mask assembly tilted with respect to a plane parallel to the ground; a deposition source facing the mask assembly; and a carrier facing the mask assembly and configured to support a display substrate. The mask assembly includes: a mask frame having a flat surface; and a mask sheet having an end on the flat surface of the mask frame and coupled to the mask frame.

24 Claims, 27 Drawing Sheets

(51) Int. Cl.
*C23C 14/24* (2006.01)
*H10K 59/12* (2023.01)

(58) Field of Classification Search
CPC ....... C23C 14/042; C23C 14/24; C23C 14/50; C23C 14/568; H01L 21/6734; H01L 21/67712; H01L 21/682; H01L 21/68764; H01L 21/67213
See application file for complete search history.

(56) References Cited

U.S. PATENT DOCUMENTS

| | | | | |
|---|---|---|---|---|
| 2020/0071813 | A1 | 3/2020 | Kim et al. | |
| 2020/0123644 | A1* | 4/2020 | Lee | H10K 71/164 |
| 2020/0251656 | A1 | 8/2020 | Kim | |
| 2022/0195592 | A1 | 6/2022 | Lee et al. | |

FOREIGN PATENT DOCUMENTS

| | | | | |
|---|---|---|---|---|
| KR | 10-1174877 B1 | 8/2012 | | |
| KR | 10-1384278 B1 | 4/2014 | | |
| KR | 10-2018-0077172 A | 7/2018 | | |
| KR | 10-1952718 B1 | 2/2019 | | |
| KR | 10-2019-0087976 A | 7/2019 | | |
| KR | 10-2020-0026353 A | 3/2020 | | |
| KR | 10-2022-0089809 A | 6/2022 | | |
| WO | WO 2012/043150 A1 | 4/2012 | | |
| WO | WO-2014155939 A1 | * | 10/2014 | C23C 14/042 |
| WO | WO 2018/110953 A1 | 6/2018 | | |
| WO | WO 2019/020167 A1 | 1/2019 | | |
| WO | WO 2021/197621 A1 | 10/2021 | | |

* cited by examiner

APPARATUS AND METHOD FOR MANUFACTURING DISPLAY DEVICE

CROSS-REFERENCE TO RELATED APPLICATION

This application claims priority to and the benefit of Korean Patent Application No. 10-2022-0055020, filed on May 3, 2022, in the Korean Intellectual Property Office, the disclosure of which is incorporated by reference herein in its entirety.

BACKGROUND

1. Field

Aspects of embodiments of the present disclosure relate to an apparatus for manufacturing a display device and a method of manufacturing a display device.

2. Description of the Related Art

Mobile electronic devices are in wide use. Some examples of mobile electronic devices in wide use recently include small electronic devices, such as mobile phones and tablet personal computers (PCs).

Such mobile electronic devices include display devices to provide various functions, for example, to provide visual information, such as images or videos to users. Recently, as other parts for driving display devices have been miniaturized, the portion of the mobile electronic device occupied by a display device has gradually been increasing. A structure that is bendable to form a certain angle from a flat state is also under development.

A display device as described above may include a plurality of pixels arranged in a pattern to implement (or display) an image. The pixels may include an intermediate layer including an emission layer. A pattern of the plurality of intermediate layers are disposed on a substrate according to the type of intermediate layer.

SUMMARY

When an intermediate layer is disposed on a substrate in a form of a pattern, the quality of an image emitted by a display device is determined according to how accurately the intermediate layer is disposed. To this end, deformation of a mask assembly used to form the pattern-shaped intermediate layer is an important consideration when the intermediate layer is formed. Embodiments of the present disclosure include an apparatus for manufacturing a display device and a method of manufacturing a display device that reduce deformation of a mask assembly.

Additional aspects and features of the present disclosure will be set forth, in part, in the description that follows and, in part, will be apparent from the description or may be learned by practice of the embodiments of the present disclosure described herein.

According to an embodiment of the present disclosure, a display apparatus includes a mask assembly tilted with respect to a plane parallel to the ground, a deposition source facing the mask assembly, and a carrier facing the mask assembly and supporting a display substrate. The mask assembly includes a mask frame having a flat surface and a mask sheet having an end on the flat surface of the mask frame and coupled to the mask frame.

The mask assembly may further include a support member dividing an opening area of the mask frame into a plurality of opening areas.

The mask frame may have an opening area at a central portion of the mask frame, and an inner surface of the opening area may be inclined.

A groove may be in a surface of the mask frame opposite to one surface of the mask frame in contact with the mask sheet.

A plurality of grooves may be in the surface opposite to the one surface of the mask frame in contact with the mask sheet, and a width of one of the plurality of grooves may be different from a width of another one of the plurality of grooves, as measured in one direction.

A plurality of grooves may be in the surface opposite to the one surface of the mask frame in contact with the mask sheet, and a depth of one of the plurality of grooves may be different from a depth of another one of the plurality of grooves, as measured in one direction.

The apparatus may further include a support unit configured to support one surface of the mask assembly and to support a lower surface of the mask assembly.

The support unit may include a supporter having an opening, a first support block spaced apart from the supporter and configured to support a rear surface of the mask assembly, and a second support block on a lower surface of the supporter and configured to support a side surface of the mask assembly.

A tilt angle of the mask assembly may be in a range of about 3 degrees to about 14 degrees.

The deposition source may include a source portion configured to accommodate and heat a deposition material and an elongated nozzle portion that is tilted with respect to the plane parallel to the ground and connected to the source portion.

The mask frame may have a trapezoidal planar shape.

A width of a planar shape of the mask frame may be smaller at an upper side of the mask frame than at a lower side of the mask frame.

The mask frame may have an opening area having a quadrangular shape at a central portion of the mask frame, and a corner portion of the opening area may be rounded.

According to another embodiment of the present disclosure, a method of manufacturing a display device includes arranging a mask assembly to be tilted with respect to a plane parallel to the ground, arranging one surface of a display substrate on a carrier and one surface of the mask assembly to face each other, and depositing a deposition material on the display substrate by passing the deposition material through the mask assembly. The mask assembly includes a mask frame having a flat surface and a mask sheet having an end on the flat surface of the mask frame and coupled to the mask frame.

The mask assembly may further include a support member dividing an opening area of the mask frame into a plurality of opening areas.

The mask frame may have an opening area at a central portion of the mask frame, and an inner surface of the opening area may be inclined.

A groove may be in a surface of the mask frame opposite to one surface of the mask frame in contact with the mask sheet.

A plurality of grooves may be in the surface opposite to the one surface of the mask frame in contact with the mask sheet, and a width of one of the plurality of grooves may be different from a width of another one of the plurality of grooves, as measured in one direction.

A plurality of grooves may be in the surface opposite to the one surface of the mask frame in contact with the mask sheet, and a depth of one of the plurality of grooves may be different from a depth of another one of the plurality of grooves, as measured in one direction.

The method may further include seating the mask assembly on a support unit, and the support unit may be configured to support one surface of the mask assembly and to support a lower surface of the mask assembly.

The support unit may include a supporter having an opening, a first support block spaced apart from the supporter and configured to support a rear surface of the mask assembly, and a second support block on a lower surface of the supporter and configured to support a side surface of the mask assembly.

A tilt angle of the mask assembly may be in a range of about 3 degrees to about 14 degrees.

The deposition material may be supplied to an elongated nozzle portion that is arranged to be tilted with respect to the plane parallel to the ground.

The mask frame may have a trapezoidal planar shape.

A width of a planar shape of the mask frame may be smaller at an upper side of the mask frame than at a lower side of the mask frame.

The mask frame may have an opening area having a quadrangular shape at a central portion of the mask frame, and a corner portion of the opening area may be rounded.

These and/or other aspects and features of the present disclosure will become apparent and more readily appreciated from the following description of the embodiments, taken in conjunction with the accompanying drawings.

These general and specific embodiments may be implemented by using a system, a method, a computer program, or a combination thereof.

BRIEF DESCRIPTION OF THE DRAWINGS

The above and other aspects and features of embodiments of the present disclosure will be more apparent from the following description, taken in conjunction with the accompanying drawings, in which.

DETAILED DESCRIPTION

Figure 1:
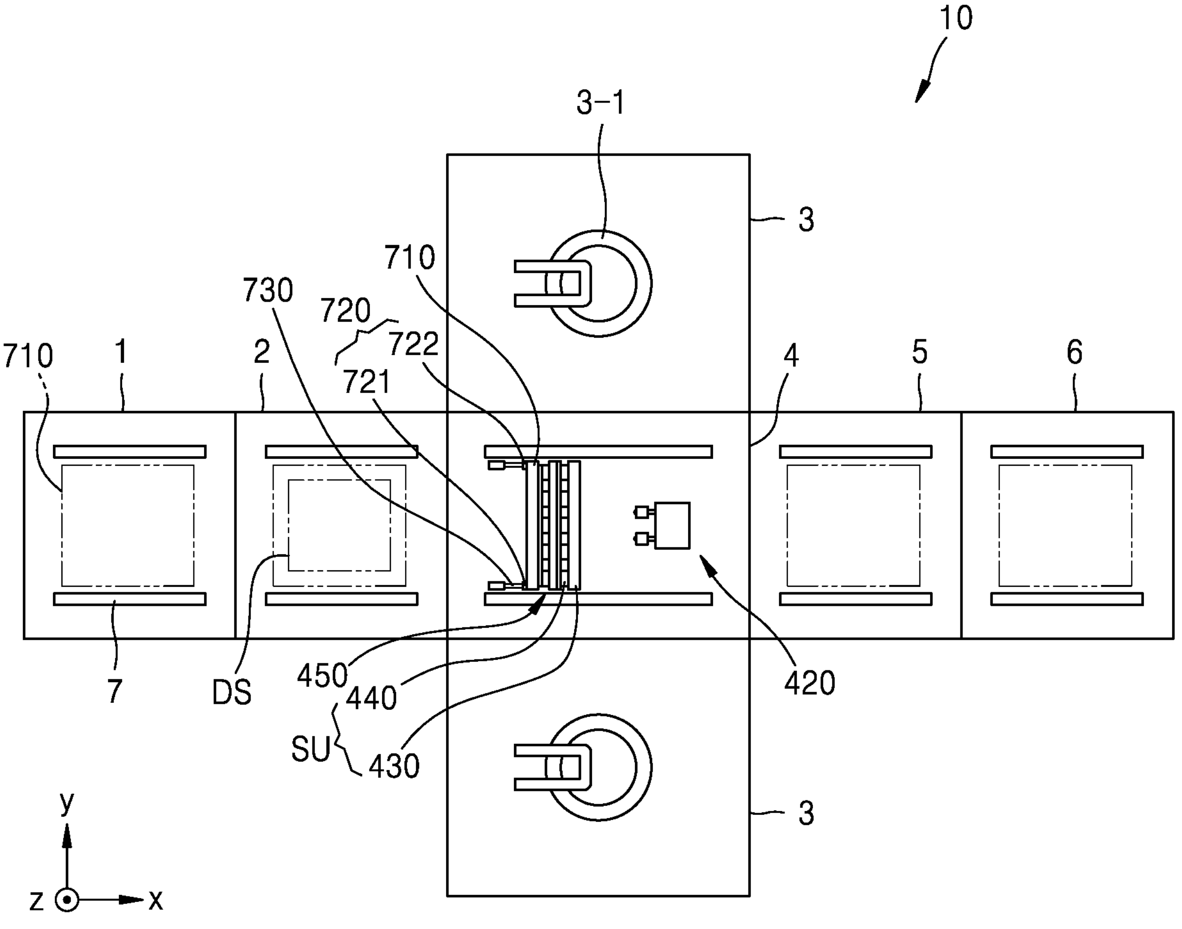
FIG. 1 is a schematic plan view of an apparatus for manufacturing a display device according to an embodiment.

Reference will now be made, in detail, to embodiments, examples of which are illustrated in the accompanying drawings. Like reference numerals refer to like elements throughout. The described embodiments may have different forms and should not be construed as being limited to the descriptions set forth herein. Accordingly, examples embodiments are merely described below, by referring to the figures, to explain aspects and features of the present disclosure.

Because the present description allows for various changes and numerous embodiments, example embodiments will be illustrated in the drawings and described in detail in the written description. Aspects and features of the present disclosure, and methods of achieving them, will be clarified with reference to embodiments described below, in detail, with reference to the drawings. However, the disclosure is not limited to the following embodiments and may be embodied in various forms.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof. The x-axis, y-axis, and z-axis are not limited to three axes of the rectangular coordinate system and may be interpreted in a broader sense. For example, the x-axis, y-axis, and z-axis may be perpendicular to one another or may represent different directions that are not perpendicular to one another.

When a certain embodiment may be implemented differently, a specific process order may be performed differently from the described order. For example, two consecutively described processes may be performed substantially at the same time or performed in an order opposite to the described order.

Figure 2:
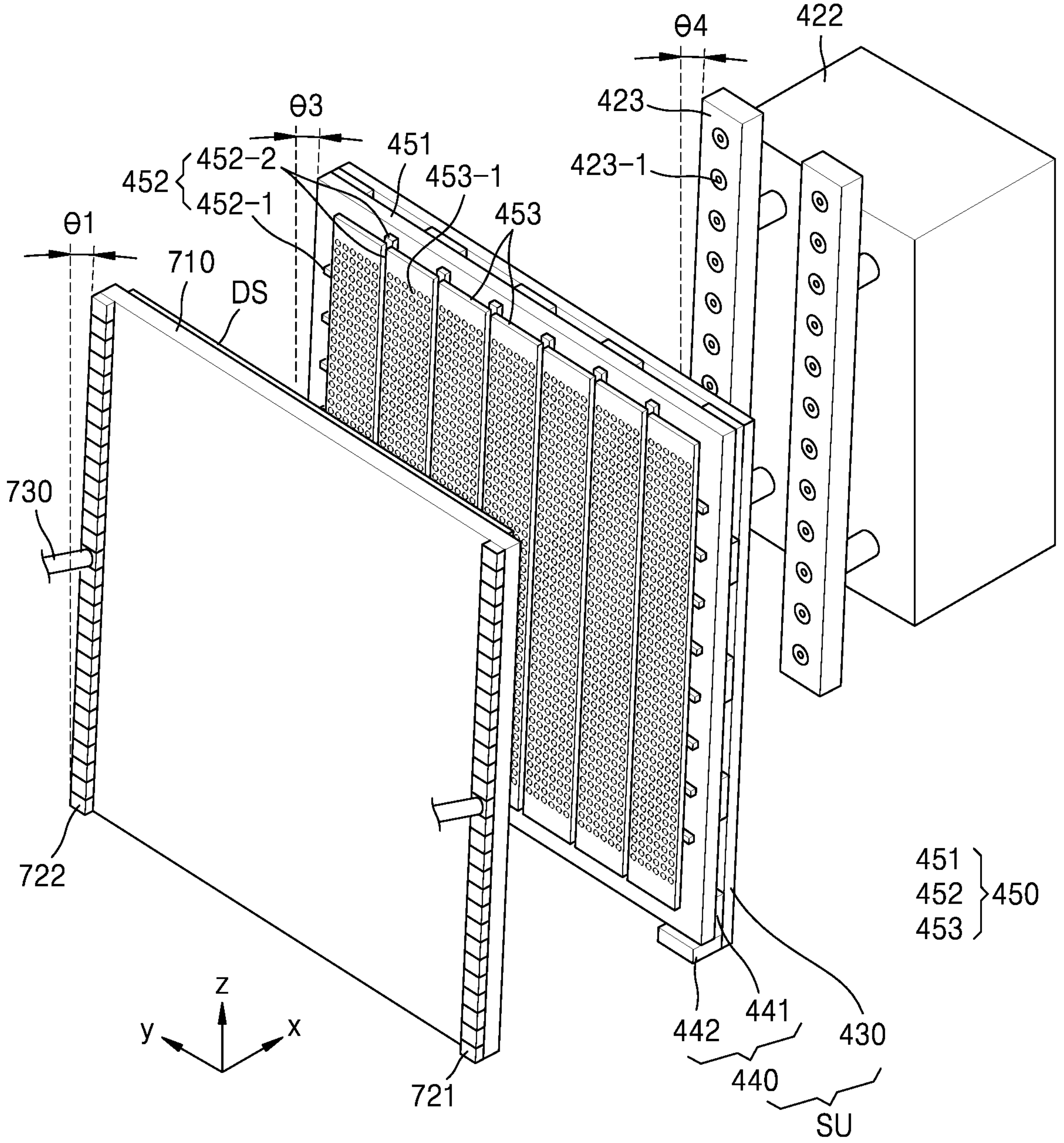
FIG. 2 is an exploded perspective view of part of a deposition portion shown in FIG. 1.
Figure 3:
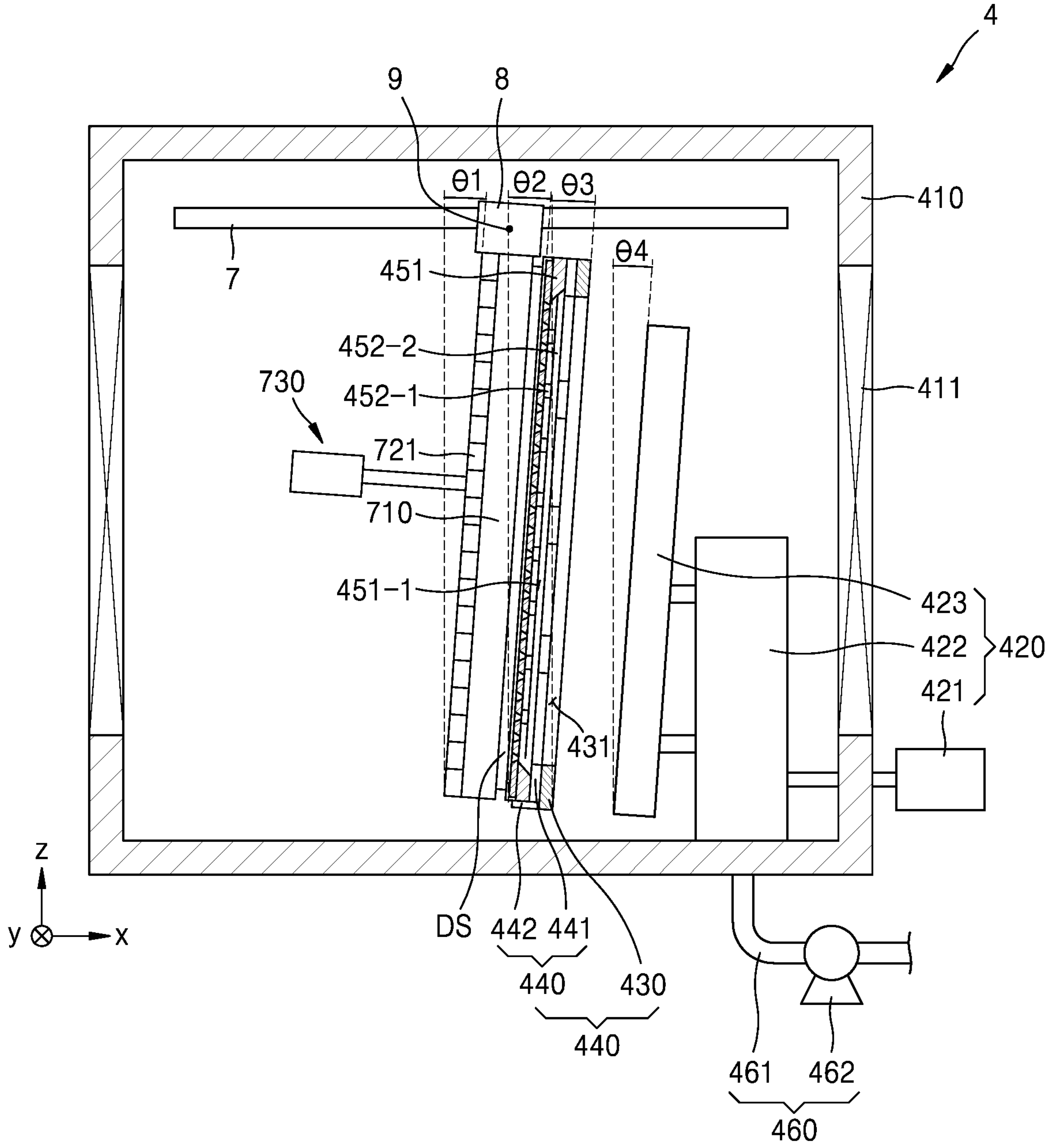
FIG. 3 is a schematic cross-sectional view of the deposition portion shown in FIG. 1.

FIG. 1 is a schematic plan view of an apparatus 10 (hereinafter, referred to as a display device manufacturing apparatus 10) for manufacturing a display device according to an embodiment. FIG. 2 is an exploded perspective view of a part of a deposition portion shown in FIG. 1. FIG. 3 is a schematic cross-sectional view of the deposition portion shown in FIG. 1.

Referring to FIGS. 1 to 3, the display device manufacturing apparatus 10 may include a loading portion 1, a first inverter 2, a mask assembly loading portion 3, a deposition portion 4, a second inverter 5, an unloading portion 6, and a linear driver 7.

The loading portion 1 may be a space (e.g., an area) in which a display substrate DS is introduced from the outside and is arranged on a carrier 710. For example, the carrier 710 may fix (e.g., may support) the display substrate DS while being arranged in the loading portion 1. The display substrate DS may be supplied to the loading portion 1 by a robot arm or the like arranged at the outside of the loading portion 1, and one surface of the display substrate DS may be attached to the carrier 710 by electrostatic force. In such an embodiment, one surface of the carrier 710 to which the display substrate DS is attached may face downwardly. The carrier 710 may face the mask assembly 450.

The first inverter 2 may invert the carrier 710. For example, the first inverter 2 may invert the carrier 710, and thus, one surface of the carrier 710, which faces downwardly and to which the display substrate DS is attached, may face upwardly. In a method of inverting the carrier 710, the carrier 710 may be rotated by a robot arm, a separate driver, or the like provided in the first inverter 2. In another embodiment, a driver, such as a motor, for rotating the carrier 710 may be arranged in a region in which the carrier 710 and the linear driver 7 are connected to each other to rotate the carrier 710. Hereinafter, for convenience of description, an embodiment in which a driver is provided in a region in which the carrier 710 and the linear driver 7 are connected to each other to rotate the carrier 710 will be primarily described in detail.

The deposition portion 4 may be connected to the first inverter 2 to perform deposition on the display substrate DS. The deposition portion 4 may include a chamber 410, a support unit SU, a deposition source 420, and a pressure regulator 460.

The chamber 410 may be connected to the first inverter 2, the mask assembly loading portion 3, and the second inverter 5 and may be formed such that a portion of the chamber 410 is opened. An opening/closing portion 411, such as a gate valve, may be arranged in the opened portion of the chamber 410. In such an embodiment, the opening/closing portion 411 may be selectively opened to connect the chamber 410 to the first inverter 2, the mask assembly loading portion 3, or the second inverter 5.

The support unit SU may support a mask assembly 450. For example, the support unit SU may be configured to support a rear surface of the mask assembly 450 and to support a lower surface of the mask assembly 450. The support unit SU may support the mask assembly 450 in a tilted state with respect to the lower surface of the chamber 410 (or the ground). For example, the mask assembly 450 may be arranged inside the chamber 410 in an upright state, and the support unit SU may maintain the mask assembly 450 in an upright state.

The support unit SU may include a supporter 430 with an opening 431 arranged at a central portion thereof and may include a plurality of support blocks 440 disposed on a surface of the supporter 430.

The supporter 430 may have the same shape as a window frame, and the opening 431 may be arranged at the central portion of the supporter 430. The opening 431 may be through where (e.g., may have a shape through which) a deposition material supplied from the deposition source 420 passes. One surface of the supporter 430 may have a flat shape. The supporter 430 may be connected to the chamber 410, and the supporter 430 may be fixed to the lower surface of the chamber 410 or may be connected to the inner surface of the chamber 410 via a separate structure. Hereinafter, for convenience of description, an embodiment in which the supporter 430 is fixed to the lower surface of the chamber 410 will be primarily described in detail.

The plurality of support blocks 440 may include a first support block 441 and a second support block 442. The first support block 441 may support the one surface of the mask assembly 450 (or the one surface of the mask frame 451). For example, the first support block 441 may support the rear surface of the mask assembly 450 (e.g., the rear surface of the mask frame 451). For example, the first support block 441 may support the mask assembly 450 facing the supporter 430. A plurality of first support blocks 441 may be provided. In this case, ones of the plurality of first support blocks 441 may be spaced apart from each other along the outer surface of the supporter 430, and each of the plurality of first support blocks 441 may be arranged between the supporter 430 and the mask assembly 450 to support the mask assembly 450.

The second support block 442 may be disposed on the supporter 430 to support a lower surface (or a side surface) of the mask assembly 450, for example, a lower surface (or a side surface) of the mask frame 451. For example, the second support block 442 may support one surface of the mask assembly 450 that is not supported by the first support block 441. In such an embodiment, the second support block 442 may be disposed only under the mask assembly 450.

The support unit SU may support the mask assembly 450 in a tilted state. In this case, an upper portion of the mask assembly 450 may be more inclined toward (e.g., may be nearer to) the deposition source 420 than a lower portion of the mask assembly 450 is. The tilt angle θ2 of the mask assembly 450 may be in the range of about 3° or more and about 14° or less. The tilt angle θ2 of the mask assembly 450 may refer to an angle between a line segment perpendicular to the lower surface of the chamber 410 (or the ground) and a flat surface of the mask assembly 450. That is, the tilt angle θ2 of the mask assembly 450 may refer to an angle at which the mask assembly 450 is tilted with respect to the gravitational direction. The tilt angle θ3 of the support unit SU may refer to an angle at which the support unit SU is tilted with respect to the gravitational direction.

The mask assembly 450 may include a mask frame 451, a mask sheet 453, and a support member 452. An opening area (e.g., an opening) 451-1 may be at the center of the mask frame 451. In this case, the mask frame 451 may be formed similarly to the supporter 430 described above.

One surface of the mask frame 451 may be flat. For example, one surface of the mask frame 451 in contact with the mask sheet 453 may be flat. In addition, an avoiding groove 451-4 (as shown in, e.g., FIG. 5A, FIG. 8B. and FIG. 9B) may be formed on one surface of the mask frame 451 in contact with the mask sheet 453 to correspond to the end of the support member 452. The avoiding groove 451-4 may provide a space in which a bur or the like may be accommodated, or a cutting device may be inserted when the end of the support member 452 is cut.

The mask sheet 453 may be disposed to shield (e.g., to cover) the opening area 451-1. In one embodiment, one mask sheet 453 may be provided, and the one mask sheet 453 may entirely cover the opening area 451-1. In another embodiment, a plurality of mask sheets 453 may be provided, and the plurality of mask sheets 453 may be arranged adjacent to each other and may be arranged in one direction. For example, a longitudinal direction of each of the mask sheets 453 may be a direction (e.g., a direction oblique to the z-axis of FIG. 2) tilted at an angle with respect to a straight line perpendicular to the lower surface of the chamber 410. Also, the direction in which the plurality of mask sheets 453 are arranged may be a y-axis direction of FIG. 2. In this case, the plurality of mask sheets 453 may be arranged adjacent to each other to thereby shield (or cover) the opening area 451-1. Hereinafter, for convenience of description, an embodiment in which a plurality of mask sheets 453 are provided will be primarily described in detail.

Each mask sheet 453 may include a plurality of pattern openings 453-1. The plurality of pattern openings 453-1 may be arranged to be spaced apart from each other in each mask sheet 453. The plurality of pattern openings 453-1 may be arranged in the opening area 451-1.

The support member 452 may be arranged between the mask sheet 453 and the mask frame 451 to support the mask sheet 453 and to partition the opening area 451-1 into a plurality of opening areas. The support member 452 may include a first support member 452-1 and a second support member 452-2 arranged in different directions. The first support member 452-1 and the second support member 452-2 may be integrally formed with each other or formed separately from each other and combined (or coupled). Hereinafter, for convenience of description, an embodiment in which the first support member 452-1 and the second support member 452-2 are formed separately and combined through welding or the like will be mainly described in detail.

The support member 452 may support the mask sheet 453. For example, the end of the support member 452 may be inserted into the mask frame 451 or disposed on one surface of the mask frame 451.

The deposition source 420 may supply a deposition material to the mask assembly 450. The deposition source 420 may include a deposition material supplier 421, a source portion 422, and a nozzle portion (e.g., an elongated nozzle portion) 423. The deposition source 420 may face the mask assembly 450.

The deposition material supplier 421 may receive a deposition material and may provide the deposition material to the source portion 422. The deposition material supplier 421 may be arranged outside of or inside the chamber 410. The deposition material supplier 421 may include a pump or the like to supply a deposition material to the source portion 422. Hereinafter, for convenience of description, an embodiment in which the deposition material supplier 421 is arranged outside the chamber 410 will be primarily described in detail.

The source portion 422 may be arranged inside the chamber 410 and may be connected to the deposition material supplier 421 to vaporize or sublimate the deposition material. The source portion 422 may include a crucible in which a deposition material is accommodated and a heater to heat the crucible. In other words, the source portion 422 may be configured to accommodate and heat a deposition material.

The nozzle portion 423 may be tilted with respect to the plane parallel to the ground. The nozzle portion 423 may be connected to the source portion 422. For example, the nozzle portion 423 may be connected to the source portion 422 via a pipe or the like. The nozzle portion 423 may include at least one nozzle. The nozzle portion 423 may be formed to have a rectangular column shape, and a long side portion of the nozzle portion 423 may be disposed obliquely with respect to a direction (e.g., a z-axis direction of FIG. 3). In this case, an angle θ4 at which the nozzle portion 423 is tilted may be the same as or similar to the angle θ2 at which the mask assembly 450 is tilted. The nozzle portion 423 may include a spray portion 423-1 through which the deposition material is sprayed. The spray portion 423-1 may have a circular hole shape. In another embodiment, the spray portion 423-1 may be a hole (e.g., an opening) in the form of a long slot. In another embodiment, the spray portion 423-1 may have a shape protruding from the outer surface of the nozzle portion 423.

The pressure regulator 460 may be connected to the chamber 410 to adjust the pressure inside the chamber 410. The pressure regulator 460 may include a pipe 461 connected to the chamber 410 and a pump 462 arranged in (or along) the pipe 461.

The second inverter 5 may invert the carrier 710 drawn out from the deposition portion 4. To this end, the second inverter 5 may be the same as or similar to the first inverter 2.

The unloading portion 6 may separate the display substrate DS from the carrier 710 after it is inverted by the second inverter 5 and may transport the display substrate DS to the outside. In this case, a separate robot arm or the like may be arranged inside of or outside the unloading portion 6 to move the display substrate DS.

The mask assembly loading portion 3 may temporarily store the mask assembly 450 and then move the mask assembly 450 from the mask assembly loading portion 3 to the deposition portion 4. The mask assembly loading portion 3 may include a transfer portion 3-1, and the transfer portion 3-1 may be a robot arm, a shuttle, or the like. Hereinafter, for convenience of description, an embodiment in which the transfer portion 3-1 is a robot arm will be primarily described in detail.

The linear driver 7 may be individually arranged in the loading portion 1, the first inverter 2, the deposition portion 4, the second inverter 5, and the unloading portion 6. The ends of the linear driver 7 arranged in each of the loading portion 1, the first inverter 2, the deposition portion 4, the second inverter 5, and the unloading portion 6 may be spaced apart from each other. In this case, the distance between linear drivers 7 may be a distance by which the carrier 710 may move (e.g., the liner drivers 7 may be spaced apart by a distance smaller than a corresponding dimension of the carrier 710).

The linear driver 7 may be a magnetic levitator. For example, the linear driver 7 may include an electromagnet or a rail in the form of a magnet. In addition, the linear driver 7 may include a motion block 8 that moves along a rail. The motion block 8 may be connected to the carrier 710, and a driver for rotating the carrier 710 or tilting the carrier 710 may be arranged between the motion block 8 and the carrier 710.

The carrier 710 may include an electrostatic chuck, such as a carrier electrostatic chuck (ESC). In addition, the carrier 710 may include a wireless charging module, a secondary battery, and the like.

A magnetic force generator 720 may be an electromagnet. In this case, at least one magnetic force generator 720 may be provided. When a plurality of magnetic force generators 720 are provided, the plurality of magnetic force generators 720 may be arranged in a line. In addition, the plurality of magnetic force generators 720 may be arranged in a height direction of the carrier 710. Through this arrangement, the magnetic force generators 720 may provide a magnetic force so that a side portion of the mask assembly 450 is in close contact with the display substrate DS. Also, because the magnetic force generators 720 are not arranged in a line at upper and lower portions of the mask assembly 450, a change in a tilt angle $\theta 2$ of the tilted mask assembly 450 may be prevented.

The magnetic force generator 720 may include a first magnetic force generator 721 and a second magnetic force generator 722 arranged to be spaced apart from each other. In such an embodiment, the first magnetic force generator 721 and the second magnetic force generator 722 may be arranged parallel to each other.

The magnetic force generator 720 may be connected to a position controller 730. The position controller 730 may include a cylinder connected to the magnetic force generator 720, a linear motor, and the like. In addition, the position controller 730 may be individually connected to each magnetic force generator 720 or may be concurrently (e.g., simultaneously or jointly) connected to a plurality of magnetic force generators 720. The position controller 730 may adjust the distance between the carrier 710 and the magnetic force generator 720 by varying the position of the magnetic force generator 720.

The magnetic force generator 720 and the position controller 730 may be arranged inside the chamber 410.

The display device manufacturing apparatus 10 is not limited to the above description. For example, in some embodiments, the first inverter 2 and the second inverter 5 may be omitted or only one mask assembly loading portion 3 may be provided. When the first inverter 2 and the second inverter 5 are omitted, the loading portion 1, the deposition portion 4, and the unloading portion 6 may be sequentially connected to each other. In another embodiment, the display device manufacturing apparatus 10 may include only the deposition portion 4 or may include only the deposition portion 4 and the mask assembly loading portion 3. In another embodiment of the display device manufacturing apparatus 10, the deposition portion 4 is connected to other equipment. However, hereinafter, for convenience of description, an embodiment in which the display device manufacturing apparatus 10 is formed as shown in FIG. 1 will be primarily described in detail.

When a display device is manufactured by using the display device manufacturing apparatus 10, the display substrate DS may be manufactured and fixed to the carrier 710 through the loading portion 1. The display substrate DS may be in a stacked form from a substrate BS, to be described below with reference to FIG. 11, to a pixel defining layer 323, a stacked form from the substrate BS to a first functional layer 332*a*, or a stacked form from the substrate BS to an emission layer 332*b*. However, hereinafter, for convenience of description, an embodiment in which the display substrate DS is in a stacked form from the substrate BS to the first functional layer 332*a* will be primarily described in detail.

The carrier 710 to which the display substrate DS is attached may move from the loading portion 1 to the first inverter 2. The carrier 710 may be inverted in the first inverter 2. The carrier 710 may move from the first inverter 2 to the deposition portion 4.

Before the carrier 710 is transferred to the deposition portion 4 or after the carrier 710 is transferred, the mask assembly loading portion 3 may transfer the mask assembly 450 to the deposition portion 4. The mask assembly loading portion 3 may place the mask assembly 450 on the support unit SU in a tilted state with respect to a straight line perpendicular to the lower surface of the chamber 410. In this case, the mask assembly 450 may be disposed in a tilted state on the support unit SU.

Deformation due to the load of the mask assembly 450 may be reduced when the mask assembly 450 is disposed as described above than when the mask assembly 450 is completely horizontally disposed on the lower surface of the chamber 410. In addition, because the deformation of the mask assembly 450 is within an range (e.g., a reduced range) compared to a case where the mask assembly 450 is disposed perpendicularly to the lower surface of the chamber 410, the deposition quality may be improved. For example, when the mask assembly 450 is horizontally disposed on the lower surface of the chamber 410, a central portion of the mask sheet 453 may be droopy due to the load of each component of the mask assembly 450. In this case, a deposition material passing through the mask sheet 453 may not be deposited in a precise pattern on the display substrate DS. In addition, when the mask assembly 450 is disposed perpendicularly to the lower surface of the chamber 410, an upper portion of the mask frame 451 may be bent, and thus, the mask sheet 453 may not be supported and a deposition material may not be deposited on the display substrate DS in a precise pattern. However, when deposition is performed in a state where the mask assembly 450 is tilted with respect to the lower surface of the chamber 410, the above issues may be reduced, and thus, the deposition material may be deposited on the display substrate DS in a precise pattern.

After the carrier 710 enters the chamber 410, the carrier 710 may dispose the display substrate DS in a tilted state like the mask assembly 450. For example, the carrier 710 may be rotated by the driver 9 arranged in the motion block 8. The tilt angle 81 of the carrier 710 may refer to an angle at which the carrier 710 is tilted with respect to the gravitational direction.

The carrier 710, the display substrate DS, and the mask assembly 450 may maintain a tilted state with respect to a direction perpendicular to the lower surface of the chamber 410. Angles at which the carrier 710, the display substrate DS, and the mask assembly 450 are respectively tilted with respect a direction perpendicular to the lower surface of the chamber 410 may be the same or substantially the same.

When the display substrate DS and the mask assembly 450 are arranged to face each other, for example, when one surface of the display substrate DS on the carrier 710 and one surface of the mask assembly 450 are arranged to face each other, the position controller 730 may be operated to arrange (e.g., to move) the magnetic force generator 720 on the rear surface of the carrier 710 to be near to the carrier 710 (e.g., to be as close to the carrier 710 as possible). Thereafter, the magnetic force generator 720 may be operated to bring the mask assembly 450 into close contact with the display substrate DS. The magnetic force generator 720 may apply a magnetic force to the mask frame 451 to bring the mask sheet 453 into close contact with the display substrate DS.

When the above process is completed, the deposition source 420 may be operated to supply the deposition material to the display substrate DS. The magnetic force generator 720 may generate a magnetic force to bring the mask assembly 450 into close contact with the display substrate DS. As shown in, for example, FIG. 2, the mask assembly 450, the carrier 710, the display substrate DS, and the support unit SU may not be spaced apart from each other but may be arranged such that the mask assembly 450 and the display substrate DS are in close contact with each other.

The deposition material may pass through the pattern openings 453-1 of the mask sheet 453 to be deposited on the display substrate DS. For example, the deposition material may be disposed in an open region of the pixel defining layer 323 shown in, for example, FIG. 11. In such an embodiment, the deposition materials passing through the plurality of pattern openings 453-1 may be disposed to be spaced apart from each other (e.g., to be patterned on the display substrate DS).

When the above process is completed, the carrier 710 may be rotated again and then moved from the deposition portion 4 to the second inverter 5 according to an operation of the linear driver 7. After the carrier 710 is inverted in the second inverter 5, the carrier 710 may move to the unloading portion 6. In the unloading portion 6, the deposition-completed display substrate DS may be withdrawn to the outside. Thereafter, the display device may be manufactured by disposing other layers on the display substrate DS.

According to the display device manufacturing apparatus 10 and a method (hereinafter, referred to as a display device manufacturing method) of manufacturing a display device by using the display device manufacturing apparatus 10 according to embodiments of the present disclosure, a deposition material may be deposited on the display substrate DS in a precise pattern by using the mask assembly 450 having reduced deformation.

By using the display device manufacturing apparatus 10 and the display device manufacturing method, a display device that implements a clear image may be manufactured.

Pixel position accuracy (PPA) may vary according to a tilt angle θ2 of the mask assembly 450. When the PPA rapidly changes depending on the tilt angle θ2, the deposition material may not be deposited at a correct position, and thus, pixels of the manufactured display device may not emit light or the plane areas of pixels emitting light of the same color may be different from each other. Accordingly, the image quality of the display device may be unclear. In addition, when the PPA rapidly changes, the deposition quality may not be uniform, and thus, when deposition is repeatedly performed, display devices having different qualities may be manufactured. For example, a lower PPA is better, but it is necessary that the PPA does not rapidly change (e.g., that the PPA is relatively stable). When the tilt angle θ2 of the mask assembly 450 is less than about 3°, a section in which the PPA abruptly varies according to the tilt angle θ2 of the mask assembly 450 may occur. That is, when the tilt angle θ2 of the mask assembly 450 is less than about 3°, the entire mask assembly 450 may move toward the carrier 710 due to a magnetic force generated by the magnetic force generator 720, and thus, the tilt angle θ2 of the mask assembly 450 may vary or the upper end of the mask frame 451 may be bent toward the carrier 710. In this case, because one surface of the display substrate DS and one surface of the mask assembly 450 are not parallel to each other, the pattern of the deposition material deposited on the display substrate DS may be different from the pattern of the pattern opening 453-1. Accordingly, the tilt angle θ2 of the mask assembly 450 should be about 3° or more.

Also, when the tilt angle θ2 of the mask assembly 450 is less than about 3°, the deformation of the mask frame 451 may exceed about 50 μm. In this case, the mask sheet 453 may be different from its initial state due to the deformation of the mask frame 451. That is, because the mask sheet 453 is fixed to the mask frame 451 in a tensioned state, when the mask frame 451 is deformed, the mask sheet 453 may also be deformed. In this case, the degree of deformation of the mask sheet 453 may also vary according to the degree of deformation of the mask frame 451. The degree of deformation of the mask frame 451 may refer to a distance between an initial position of the outer surface of the mask frame 451 and a changed (or deformed) position of the outer surface of the mask frame 451, the changed position being set as the position of the outer surface of the mask frame 451 is changed from the initial position of the outer surface.

The deformation as described above may be equally applied to the support member 452. In this case, the mask frame 451 may be deformed according to the degree to which the support member 452 varies. For example, the degree to which the support member 452 varies should not exceed about 250 μm. In this case, when the degree to which the support member 452 varies exceeds about 250 μm, the support member 452 may not support the deformation of the mask frame 451 due to the load of the mask frame 451. In this case, because the mask frame 451 is excessively deformed, the mask sheet 453 may also be deformed. In the above case, the degree to which the support member 452 varies may refer to a distance by which a portion of the support member 452 is deformed when the support member 452 is maintained in a flat state and when the mask assembly 450 is maintained at a tilt angle θ2. For example, the degree to which the support member 452 varies may refer to a maximum value from among values of points of the support member 452 that is disposed at a position different from the initial position due to a load or the like. The degree to which the support member 452 varies may exceed about 250 μm when the tilt angle θ2 of the mask assembly 450 exceeds about 14°. Accordingly, when the mask assembly 450 is disposed at a tilt angle θ2 within a range of about 3° or more and about 14° or less, a display device including pixels having a precise pattern may be manufactured.

When the tilt angle θ2 of the mask assembly 450 is less than about 3°, it may be determined to what extent the mask assembly 450 moves from the support unit SU toward the carrier 710. For example, when the magnetic force generator 720 is operated at an initial position where the mask assembly 450 is disposed on the support unit SU, the upper end of the mask assembly 450 may move toward the carrier 710. When the tilt angle θ2 of the mask assembly 450 is less than about 3°, the upper end of the mask assembly 450 may move toward the carrier 710, and thus, the initial position of the mask assembly 450 may be different from the position of the mask assembly 450 when the magnetic force generator 720 operates. In this case, the deposition material passing through the pattern opening 453-1 may not accurately pass through the pattern opening 453-1 or may be deposited at a position other than the position corresponding to the pattern opening 453-1, and thus, the image quality of a manufactured display device may be unclear.

FIGS. 4A to 4H are schematic cross-sectional views of a portion of the mask assembly shown in FIG. 3.

Referring to FIGS. 4A to 4H, the opening area 451-1 may be arranged at the central portion of the mask frame 451, as described above. A portion of the mask frame 451 in contact with the mask sheet 453 may have a flat planar form, and a boundary surface (e.g., an inner surface) of the opening area 451-1 may be inclined. For example, the thickness of the boundary surface of the opening area 451-1 may decrease from one surface of the mask frame 451 facing the deposition source 420 as shown in, for example, FIG. 2 to the other surface (e.g., one surface of the mask frame 451 to which the mask sheet 453 is in contact) of the mask frame 451 facing the display substrate DS as shown in, for example, FIG. 2. Hereinafter, for convenience of description, the one surface of the mask frame 451 is referred to as a first surface (e.g., being opposite to one surface of the mask frame 451 in contact with the mask sheet 453) of the mask frame 451, and the other surface of the mask frame 451 is referred to as a second surface of the mask frame 451. The thickness of the boundary surface of the opening area 451-1 may be a distance measured from the one surface of the mask frame 451, which faces the deposition source 420 as shown in, for example, FIG. 2, to the other surface of the mask frame 451, which faces the display substrate DS as shown in, for example, FIG. 2, in a direction perpendicular to the one surface of the mask frame 451 facing the deposition source 420 as shown in, for example, FIG. 2.

In such an embodiment, when the second surface of the mask frame 451 is formed to be stepped rather than flat, deformation of the mask frame 451 may occur due to a moment generated when the mask sheet 453 is attached to the mask frame 451 and the end of the mask sheet 453 is cut. In addition, because the mask frame 451 may be additionally deformed due to the load of the mask sheet 453, the mask frame 451 may be additionally deformed from the initial shape. In this case, due to the deformation of the mask frame 451, deformation of the mask sheet 453 may occur or a tensile force applied to the mask sheet 453 may change, and thus, the position of the pattern opening 453-1 may not correspond to an intended (or preset) position. However, when the second surface of the mask frame 451 is flat as described above, the above issue may be mitigated or avoided.

A support member 452 may be disposed on the second surface of the mask frame 451. For example, a first support member 452-1 may be arranged in a direction perpendicular to a longitudinal direction of the mask sheet 453, and a second support member 452-2 may be arranged in a direction parallel to the longitudinal direction of the mask sheet 453. When a plurality of mask sheets 453 are provided, the second support member 452-2 may be arranged between adjacent ones of the mask sheets 453.

Figure 4A:
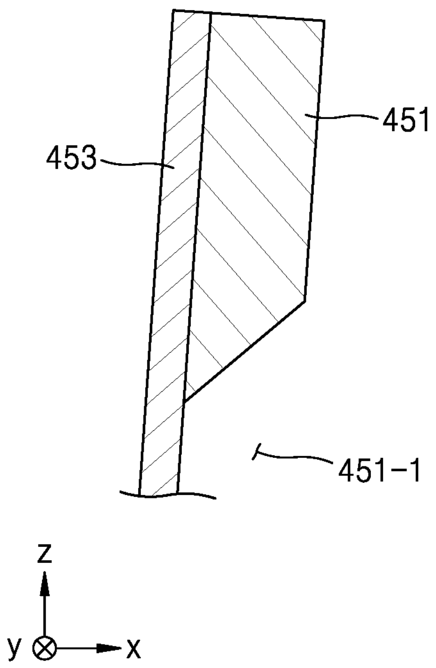
FIGS. 4A to 4H are schematic cross-sectional views of a portion of a mask assembly shown in FIG. 3.
Figure 4B:
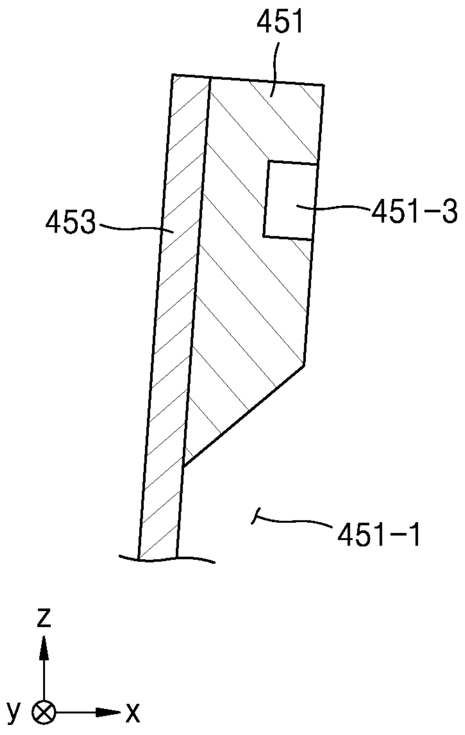

Referring to FIG. 4B, a groove 451-3 may be formed in (e.g., recessed from) the first surface of the mask frame 451. The shape of the groove 451-3 and the number of grooves 451-3 may vary. For example, the planar shape of the groove 451-3 may be irregular and may be a circular shape, a polygonal shape, or a star shape.

Figure 4C:
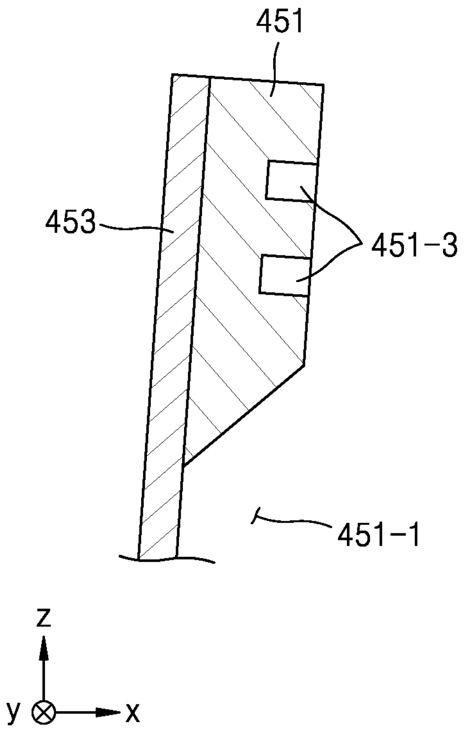

Referring to FIG. 4C, a plurality of grooves 451-3 may be formed in the first surface of the mask frame 451. The grooves 451-3 may be arranged to be spaced apart from each other. Further, the number of grooves 451-3 may be two or more. The shapes of the grooves 451-3 may be the same or different from each other. However, hereinafter, for convenience of description, an embodiment in which the plurality of grooves 451-3 include a first groove 451-3*a* and a second groove 451-3*b* will be primarily described in detail.

Figure 4D:
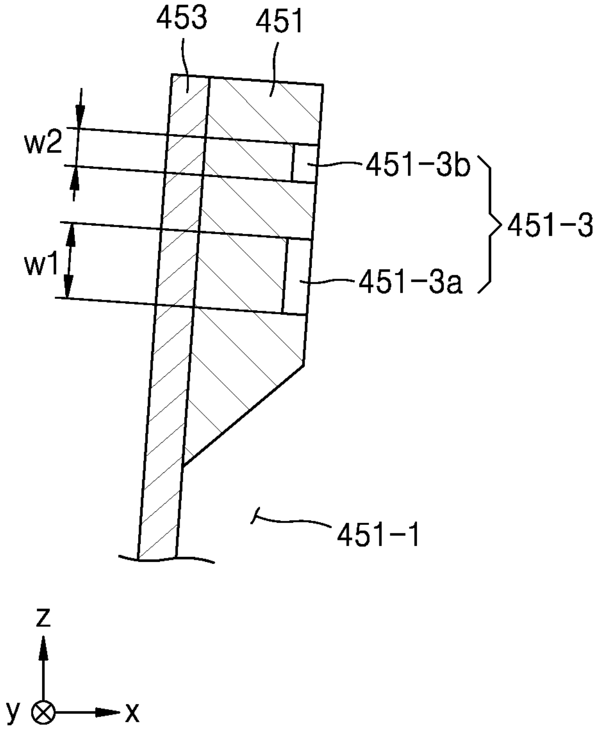
Figure 4E:
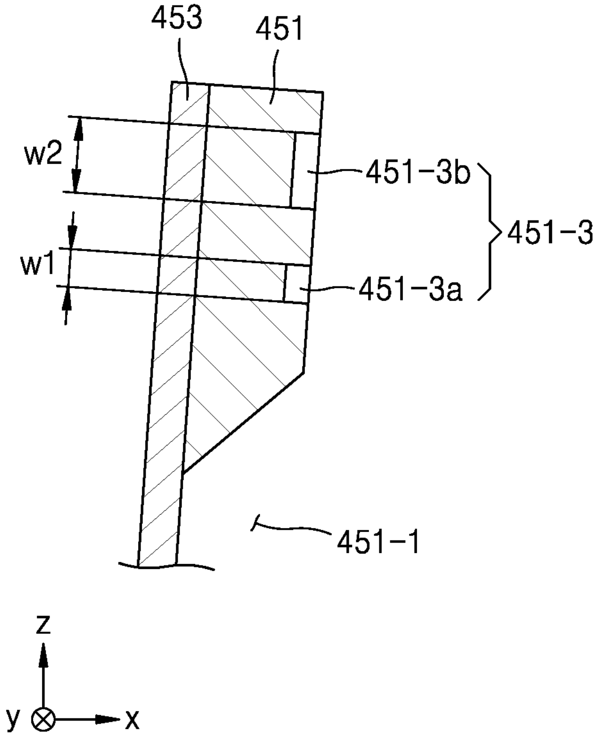

Referring to FIGS. 4D and 4E, the first groove 451-3*a* and the second groove 451-3*b* may have the same planar shape. A first width w1 of the cross-section of the first groove 451-3*a* and a second width w2 of the cross-section of the second groove 451-3*b* may be different from each other. The first groove 451-3*a* and the second groove 451-3*b* may be parallel to each other. For example, the first width w1 may be greater than the second width w2, as shown in FIG. 4D. The first width w1 may be less than the second width w2, as shown in FIG. 4E. The depth of the cross-section of the first groove 451-3*a* and the depth of the cross-section of the second groove 451-3*b* may be equal to each other.

Figure 4F:
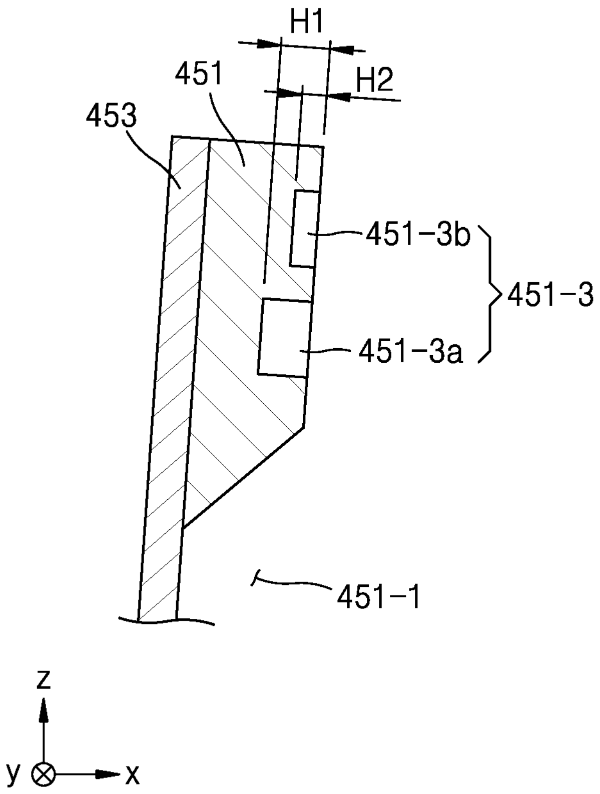
Figure 4G:
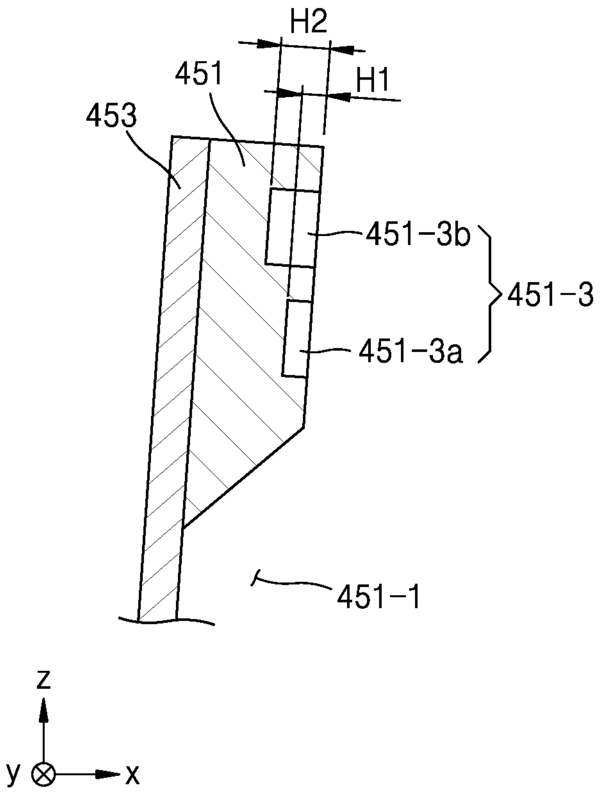

Referring to FIGS. 4F and 4G, the first groove 451-3*a* and the second groove 451-3*b* may have the same planar shape. A first depth H1 of the cross-section of the first groove 451-3*a* and a second depth H2 of the cross-section of the second groove 451-3*b* may be different from each other. The first groove 451-3*a* and the second groove 451-3*b* may be parallel to (e.g., may extend parallel to) each other. For example, the first depth H1 may be greater than the second depth H2, as shown in FIG. 4F. The first depth H1 may be less than the second depth H2, as shown in FIG. 4G. The width of the cross-section of the first groove 451-3*a* may be equal to the width of the cross-section of the second groove 451-3*b*.

When the first groove 451-3*a* and the second groove 451-3*b* have the same planar shape, the first depth H1 and the first width w1 of the cross-section of the first groove 451-3*a* may be different from the second depth H2 and the second width w2 of the cross-section of the second groove 451-3*b*, respectively.

Figure 4H:
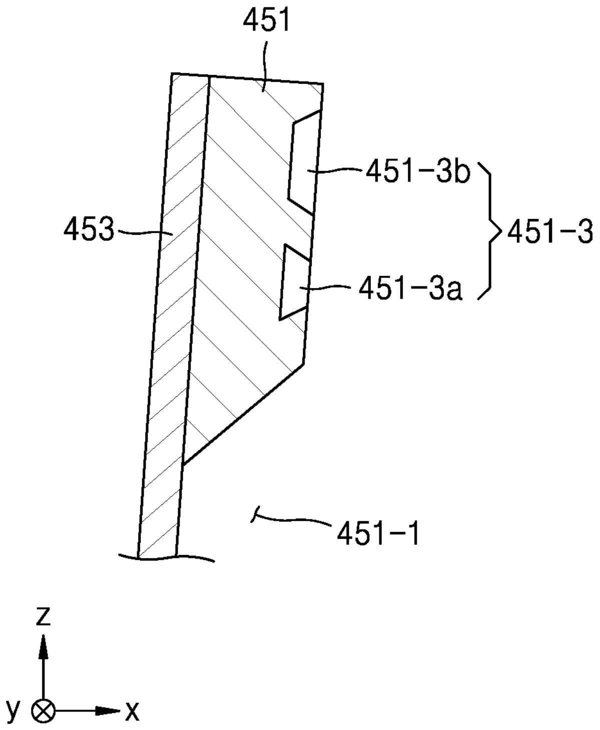

Referring to FIG. 4H, the cross-sectional shape of the first groove **451-3*a* and the cross-sectional shape of the second groove 451-3*b* may be different from each other. For example, the inner surface of the first groove 451-3*a* and the inner surface of the second groove 451-3*b* may be formed to be inclined. The inclination of the inner surface of the first groove 451-3*a* and the inclination of the inner surface of the second groove 451-3*b* may be opposite to each other. The planar shape, width, and depth of the first groove 451-3*a* may be different from the planar shape, width, and depth of the second groove 451-3*b***, respectively.

Figure 4I:
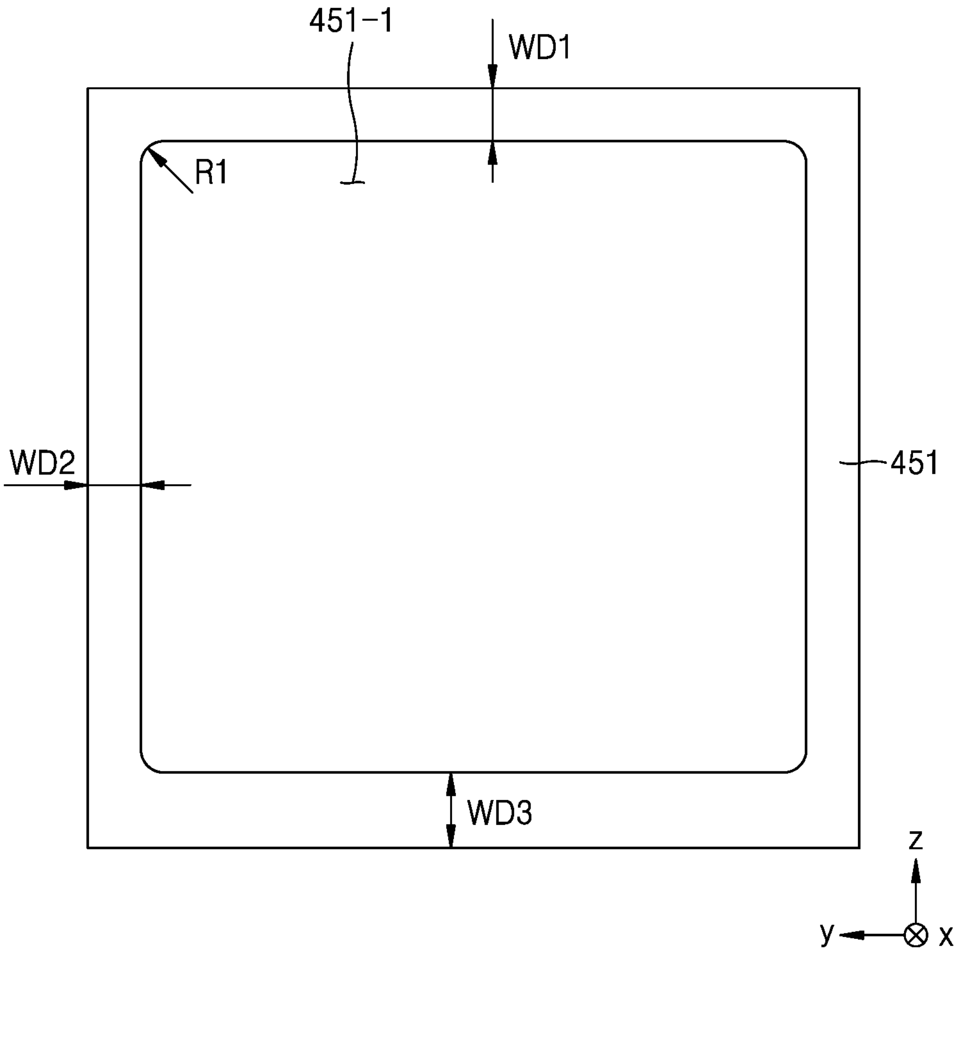
FIG. 4I is a schematic front view of a mask frame of a mask assembly according to another embodiment.

FIG. 4I is a schematic front view of a mask frame 451 of a mask assembly according to another embodiment.

Referring to FIG. 4I, the mask frame 451 may have a flat surface for contacting a mask sheet 430. The cross-section of the mask frame 451 may be the same as or similar to that of the mask frame 451 shown in FIGS. 4A to 4H.

The mask frame 451 may have an opening area 451-1 with a quadrangular shape. A corner (e.g., a corner portion) of the opening area 451-1 may be rounded. For example, the corner of the opening area 451-1 may be shaped as a portion of a circle having a first radius R1. When the corner portion of the opening area 451-1 is rounded, a concentration of stress in the corner portion of the opening area 451-1 may be reduced or prevented.

The mask frame 451 may have a rectangular or square shape. The widths of edge portions of the mask frame 451 may be different from each other. For example, a first mask frame width WD1 of one of the edge portions (e.g., an upper edge portion) of the mask frame 451 may be equal to a second mask frame width WD2 of another of the edge portions (e.g., a side edge portion) of the mask frame 451. In addition, a third mask frame width WD3 of a lower edge portion of the mask frame 451 may be greater than the first mask frame width WD1 and the second mask frame width WD2. In such an embodiment, when the mask frame 451 is vertically arranged, the lower edge portion of the mask frame 451 having the third mask frame width WD3 may be disposed on a support block 440.

Even when the mask frame 451 is vertically arranged, the lower edge portion of the mask frame 451 having a greater width than the other edge portions of the mask frame 451, as described above, may reduce deformation of the mask frame 451 due to a load.

Figure 4J:
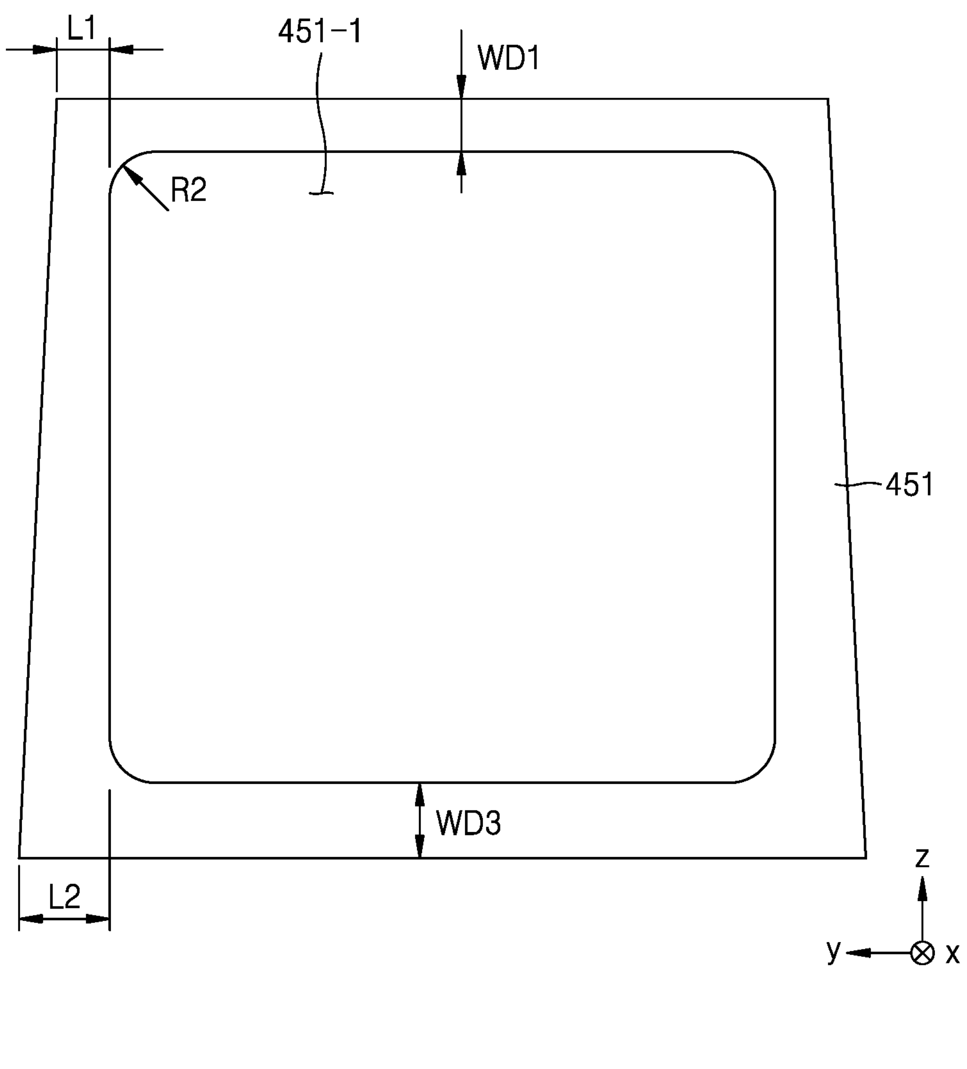
FIG. 4J is a schematic front view of a mask frame of a mask assembly according to another embodiment.

FIG. 4J is a schematic front view of a mask frame 451 of a mask assembly according to another embodiment.

Referring to FIG. 4J, the mask frame 451 of the mask assembly may have a trapezoidal planar shape. A width of a planar shape of the mask frame 451 may be smaller at an upper side of the mask frame 451 than at a lower side of the mask frame 451. The third mask frame width WD3 of a lower edge portion of the mask frame 451, which is a portion supported by the support block 440, may be greater than the first mask frame width WD1 of an upper edge portion of the mask frame 451. Accordingly, the width of a side edge portion of the mask frame 451 may increase from the upper side of the mask frame 451 to the lower side thereof. For example, an upper width L1 measured from the inner surface of the opening area 451-1 to the edge of an upper part of the side edge portion of the mask frame 451 may be less than a lower width L2 measured from the inner surface of the opening area 451-1 to the edge of a lower part of the side edge portion of the mask frame 451 In such an embodiment, the side surface of the mask frame 451 may be inclined.

A corner of the opening area 451-1 may be rounded to have a second radius R2, similar to the embodiment shown in FIG. 4I. In such an embodiment, the opening area 451-1 may have a rectangular or square shape with rounded corners.

The first mask frame width WD1, which is the width of the upper edge portion of the mask frame 451, may be different from the third mask frame width WD3, which is the width of the lower edge portion of the mask frame 451. For example, the first mask frame width WD1 may be less than the third mask frame width WD3.

A lower portion of the mask frame 451 may not be only rigid but may also support the load of the mask assembly 450 even when the mask frame 451 is tilted with respect to the ground or a plane parallel to the ground. Accordingly, the degree of deformation of the mask frame 451 may be reduced.

Figure 5A:
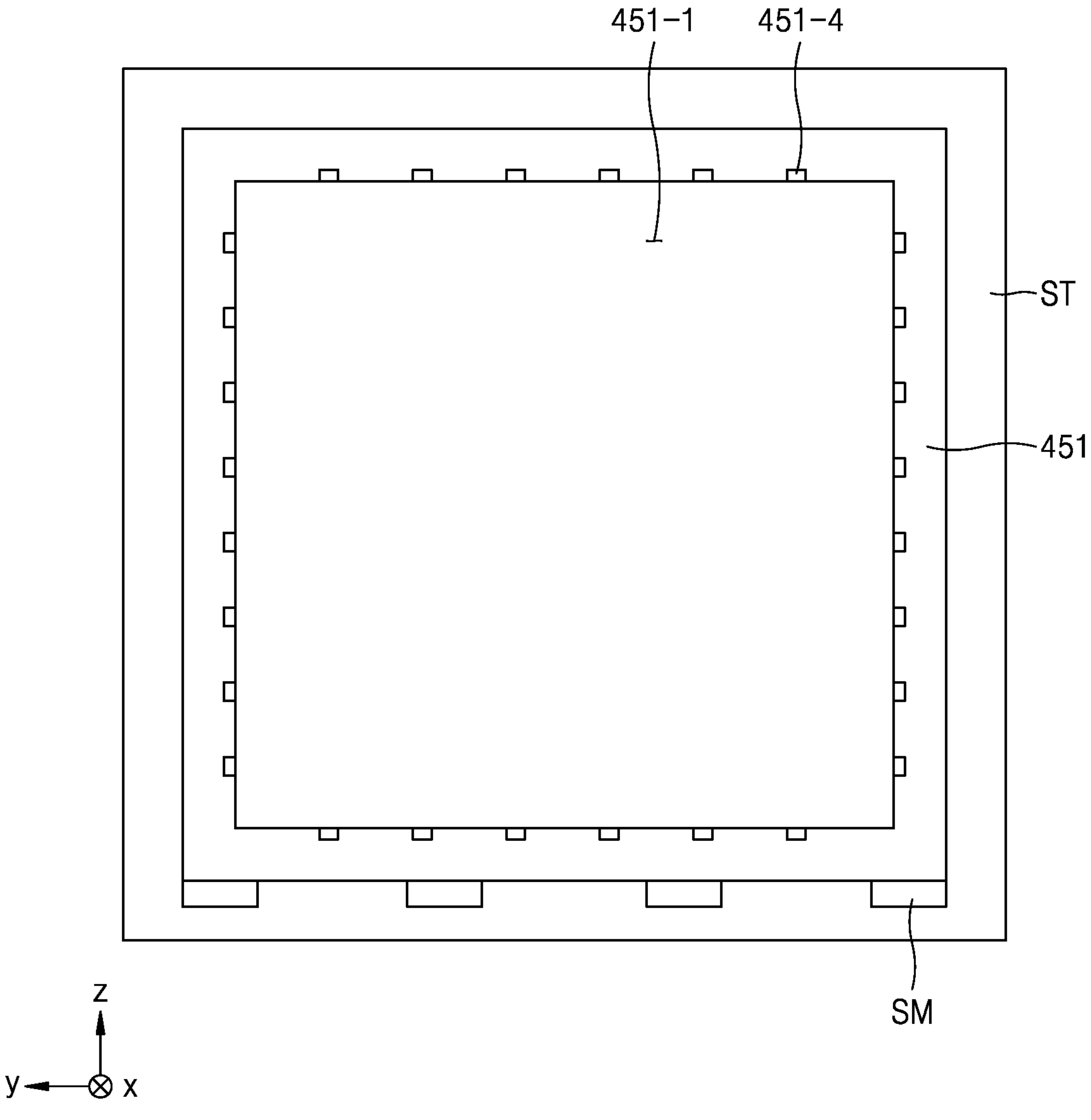
FIGS. 5A to 5C are schematic front views illustrating steps for manufacturing the mask assembly shown in FIG. 3.
Figure 5B:
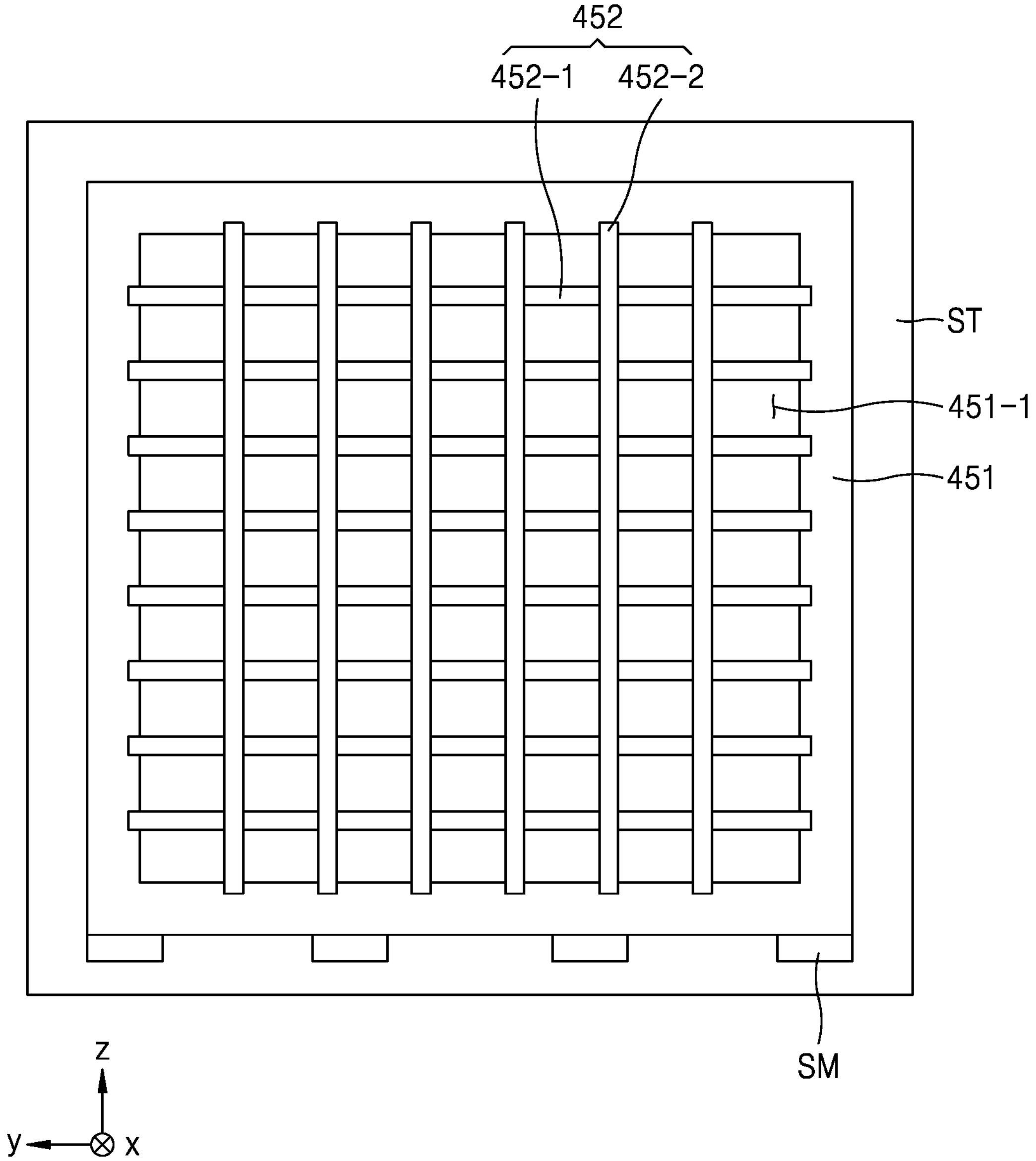
Figure 5C:
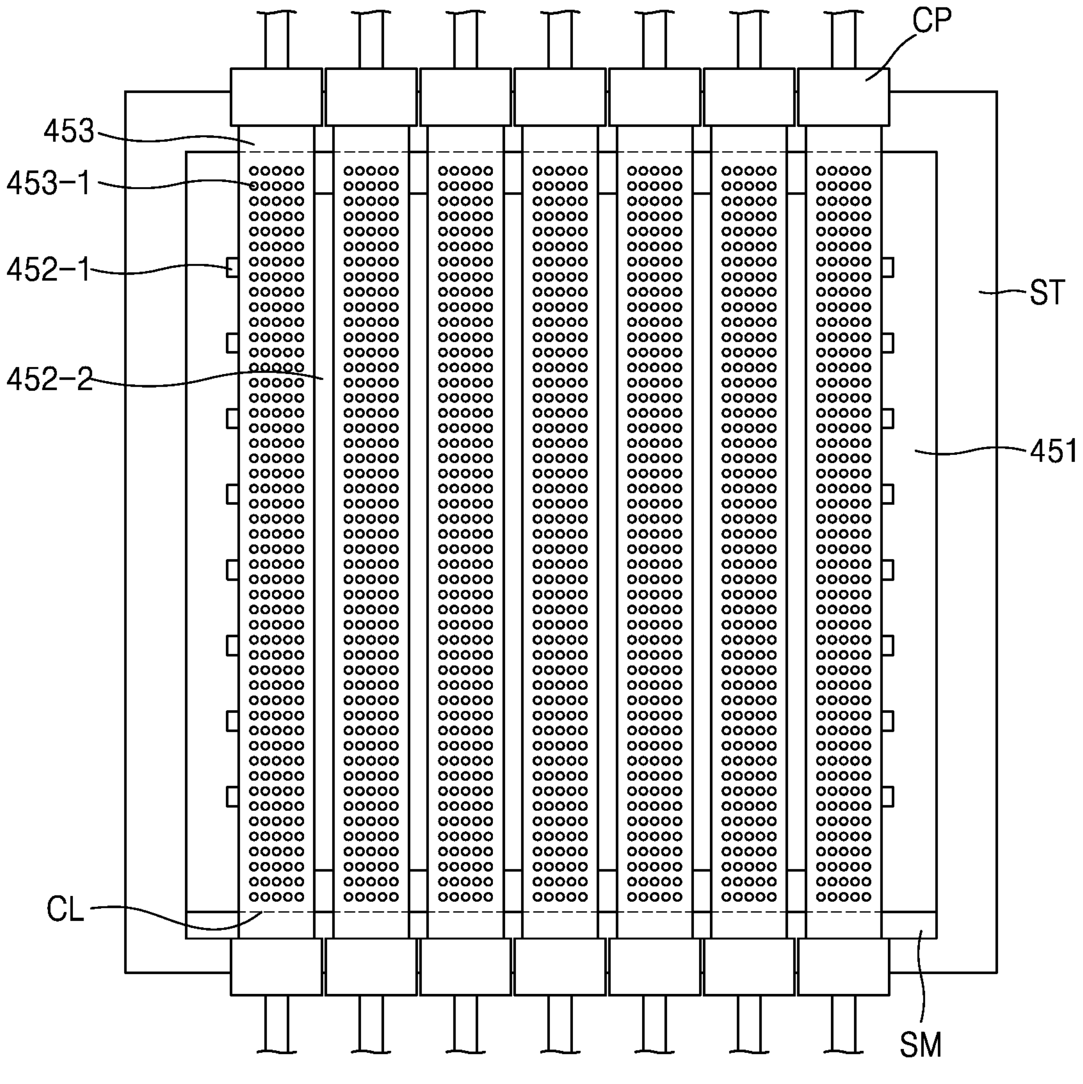

FIGS. 5A to 5C are schematic front views illustrating a procedure for manufacturing the mask assembly shown in FIG. 3.

Referring to FIG. 5A, a mask frame 451 may be disposed on a manufacturing stage ST to manufacture the mask assembly 450. A stage block SM may be disposed on the manufacturing stage ST to support the mask frame 451. The manufacturing stage ST may be arranged vertically or in a tilted state with respect to the ground or a plane parallel to the ground. Hereinafter, for convenience of description, an embodiment in which the manufacturing stage ST is arranged vertically with respect to a plane parallel to the ground will be primarily described in detail.

Referring to FIG. 5B, a support member 452 may be disposed on the mask frame 451. In such an embodiment, a first support member 452-1 and a second support member 452-2 may be coupled to each other at a point where the first support member 452-1 and the second support member 452-2 cross (or intersect) each other. In another embodiment, the first support member 452-1 and the second support member 452-2 may be integrally formed as one body. In another embodiment, the first support member 452-1 and the second support member 452-2 may be individually fixed to the mask frame 451 without being coupled to each other.

When the first support member 452-1 and the second support member 452-2 are disposed as described above, the opening area 451-1 may be divided into a plurality of areas (e.g., a plurality of opening areas).

Referring to FIG. 5C, when the first support member 452-1 and the second support member 452-2 are disposed on the mask frame 451, the mask sheet 453 may be disposed in a tensioned state. When one mask sheet 453 (e.g., a single mask sheet 453) is used, the mask sheet 453 may be formed to have a quadrangular shape, and in a state in which each side of the mask sheet 453 is pulled by a clamp unit CP, each side of the mask sheet 453 may be welded to the mask frame 451 to fix the mask sheet 453. In another embodiment, when a plurality of mask sheets 453 are used, because the mask sheets 453 have a rectangular shape, the mask sheets 453 may be tensioned in a longitudinal direction thereof by gripping, with the clamp unit CP, the end of the long side of the mask sheets 453. Thereafter, the end of the mask sheets 453 may be fixed to the mask frame 451 by welding or the like. The mask sheets 453 may be fixed to the mask frame 451 in a tensioned state. In other words, the mask sheets 453 may have an end on the flat surface of the mask frame 451 and be coupled to the mask frame 451.

After the mask sheet 453 is attached to the mask frame 451, the end of the mask sheet 453 may be cut by a separate cutting unit. For example, as shown in FIG. 5C, the mask sheet 453 disposed at a portion corresponding to the edge of the mask frame 451 may be cut along a cutting line CL.

After the end of the mask sheet 453 is cut, the mask assembly 450 may be completed. Thus, the mask sheet 453 may be fixed to the mask frame 451 in an environment similar to the environment in which the mask assembly 450 is actually used.

Figure 6A:
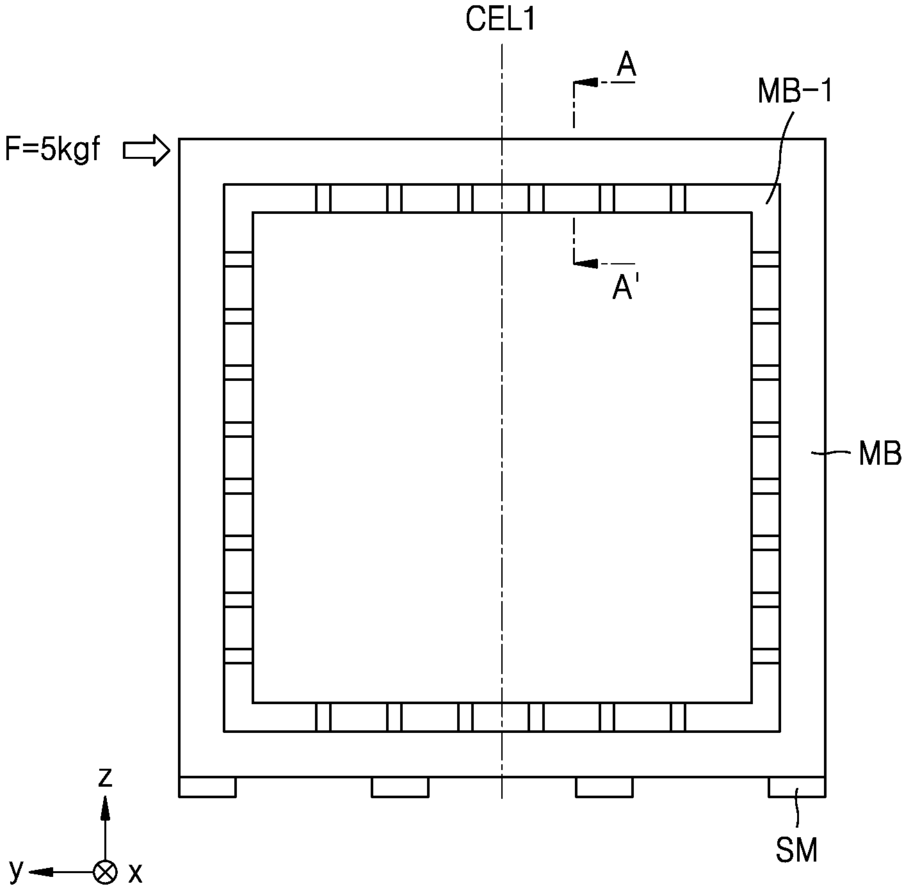
FIGS. 6A and 6B are front views illustrating a method for applying a lateral external force to a conventional mask frame and a mask frame according to embodiments.
Figure 6B:
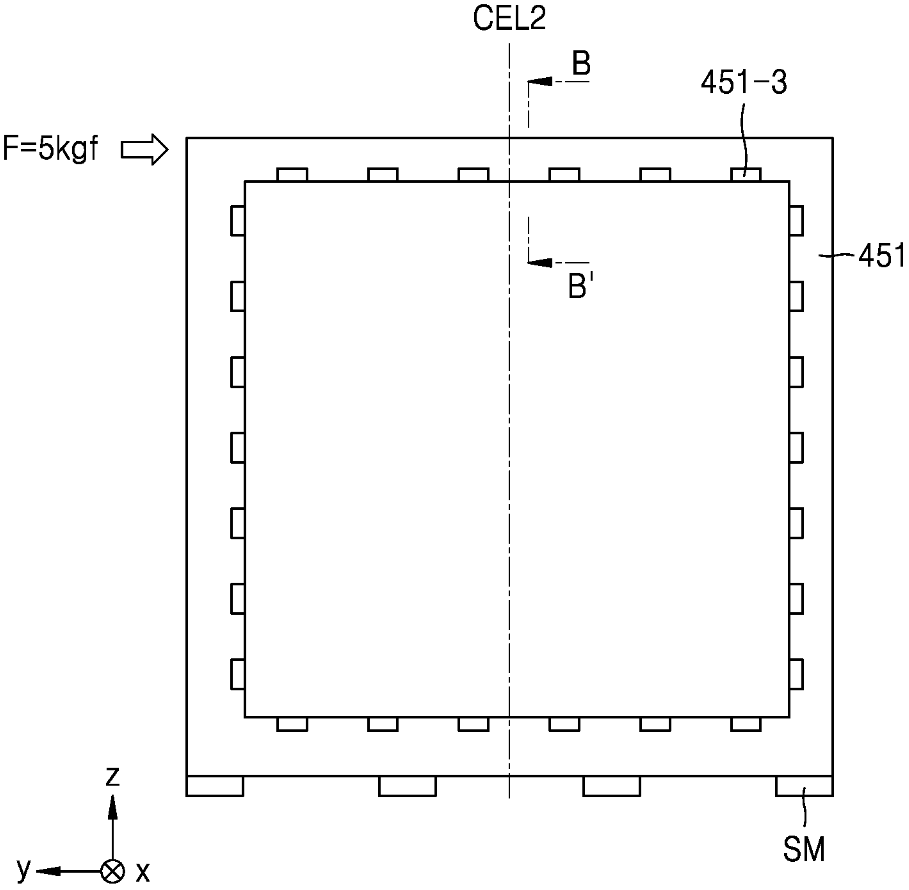
Figure 7A:
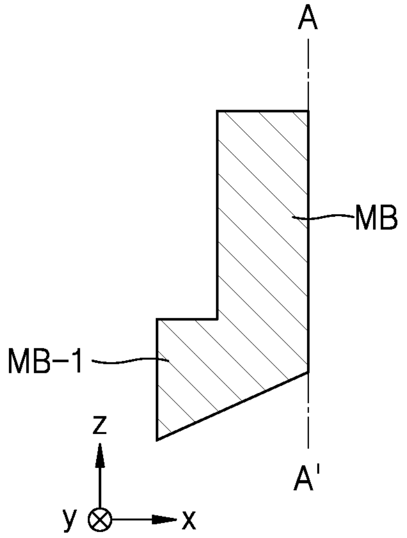
FIGS. 7A and 7B are schematic cross-sectional views respectively illustrating a portion of a conventional mask frame and a portion of a mask frame according to embodiments taken along the line A-A' in FIG. 6A and the line B-B' in FIG. 6B.
Figure 7B:
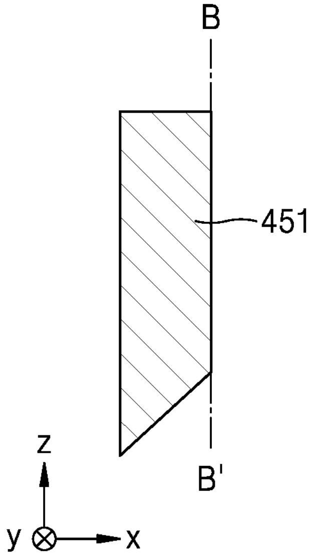

FIGS. 6A and 6B are front views illustrating a method for applying a lateral external force to a conventional mask frame MB and a mask frame 451 according to embodiments of the present disclosure, respectively. FIGS. 7A and 7B are schematic cross-sectional views respectively illustrating a portion of the conventional mask frame MB and a portion of the mask frame 451 according to embodiments, respectively.

Referring to FIGS. 6A to 7B, a second surface of the conventional mask frame MB may be stepped. For example, a second surface of the conventional mask frame MB may include a protrusion MB-1 to contact a mask sheet. On the other hand, the second surface of the mask frame 451 of a mask assembly according to embodiments may be flat. After the mask frame 451 is arranged vertically or in a tilted state with respect to the ground or a plane parallel to the ground, a force F may be applied to the side of the mask frame 451. For example, the force F may have a magnitude of about 5 kgf. In this case, when the degree of deformation of the conventional mask frame MB is compared with the degree of deformation of the mask frame 451 according to embodiments, the conventional mask frame MB may be deformed by about 21.6 μm, and the mask frame 451 according to embodiments may be deformed by about 0.1 μm. The degree of deformation of each mask frame (e.g., the conventional mask frame MB and the mask frame 451) may be a maximum value from among distances between an initial position of each mask frame and a changed position of each deformed mask frame. A point at which the degree of deformation of each mask frame is measured may be a center line of each mask frame. For example, the degree of deformation of the conventional mask frame MB may refer to a degree to which a first center line CEL1, which is the center line of the conventional mask frame MB, moves relative to an initial position. In addition, the degree of deformation of the mask frame 451 according to embodiments may refer to a degree to which a second center line CEL2, which is the center line of the mask frame 451 according to embodiments, moves relative to an initial position.

Accordingly, the mask frame 451 according to embodiments may be deformed less by a lateral external force than the conventional mask frame MB.

Figure 8A:
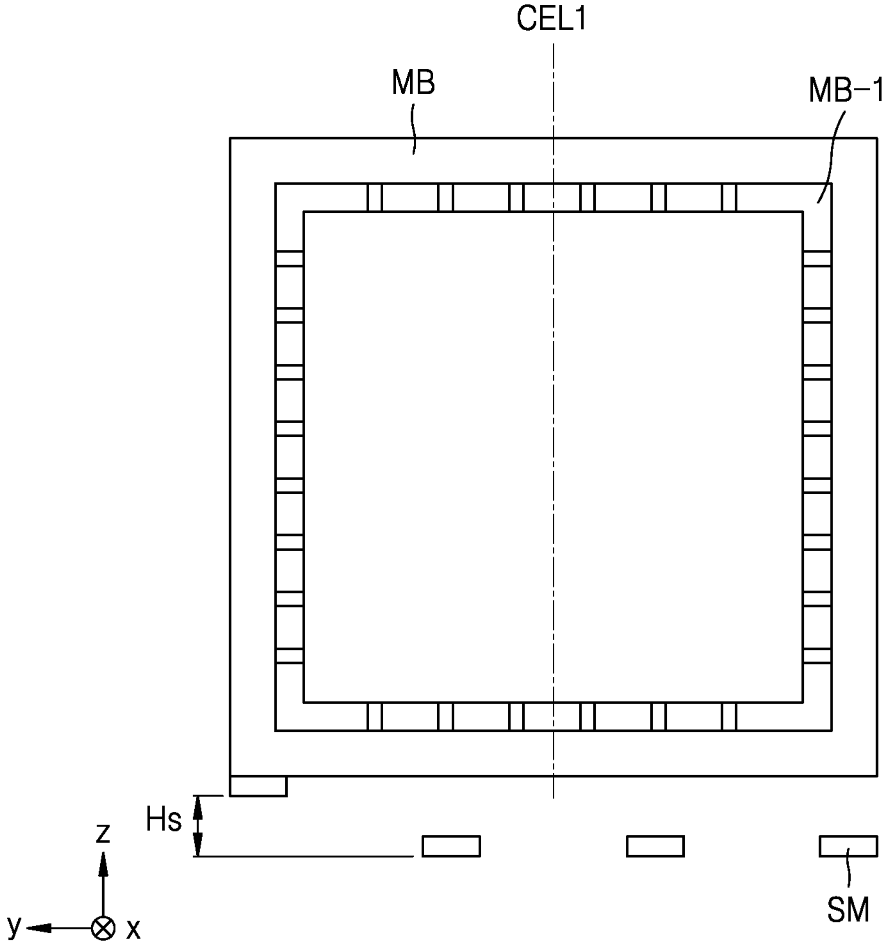
FIGS. 8A and 8B are schematic front views illustrating states in which a conventional mask frame and a mask frame according to embodiments are seated on manufacturing stages.
Figure 8B:
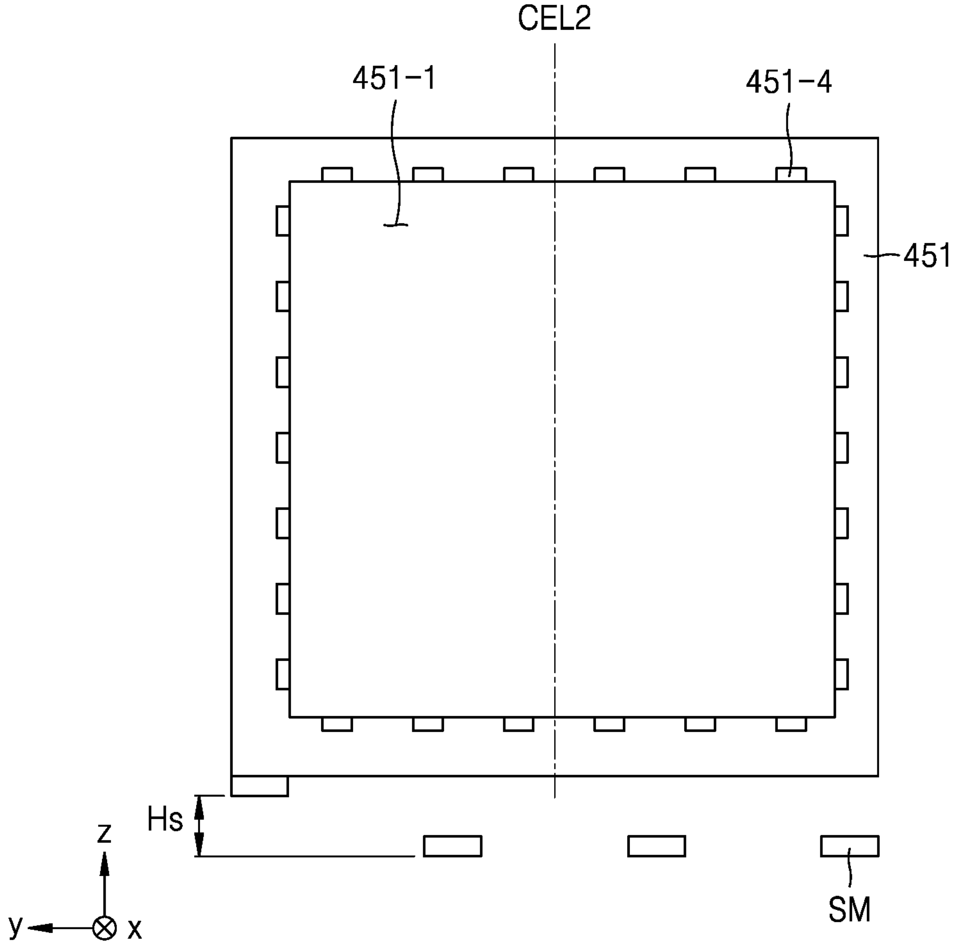

FIGS. 8A and 8B are schematic front views illustrating states in which a conventional mask frame MB and a mask frame 451 according to embodiments are seated on manufacturing stages.

Referring to FIGS. 8A and 8B, each of the conventional mask frame MB and the mask frame 451 according to embodiments may be disposed on a stage block SM of a manufacturing stage. A plurality of stage blocks SM may be arranged to be spaced apart from each other, and one of the plurality of stage blocks SM and the other one of the plurality of stage blocks SM may be disposed at different heights. For example, one of the plurality of stage blocks SM may be disposed at a lower position than the other one of the plurality of stage blocks SM. For example, one of the plurality of stage blocks SM may be disposed at a position that is lower than that of the other one of the plurality of stage blocks SM by a certain distance Hs.

In this case, whether a specific position of the conventional mask frame MB and a specific position of the mask frame 451 according to embodiments are changed may be measured. For example, the degree of deformation of the conventional mask frame MB may refer to a degree to which the first center line CEL1 of the conventional mask frame MB moves relative to an initial position. In addition, the degree of deformation of the mask frame 451 according to embodiments may refer to a degree to which the second center line CEL2 of the mask frame 451 according to embodiments moves relative to an initial position.

In the example shown in FIGS. 8A and 8B, the degree of change in the position of the first center line CEL1 may be 101.6 μm in the left direction based on the initial position of the first center line CEL1, and the degree of change in the position of the second center line CEL2 may be 4.8 μm in the right direction based on the initial position of the second center line CEL2. Accordingly, the degree of deformation of the mask frame 451 according to embodiments may be less than that of the conventional mask frame MB.

Figure 9A:
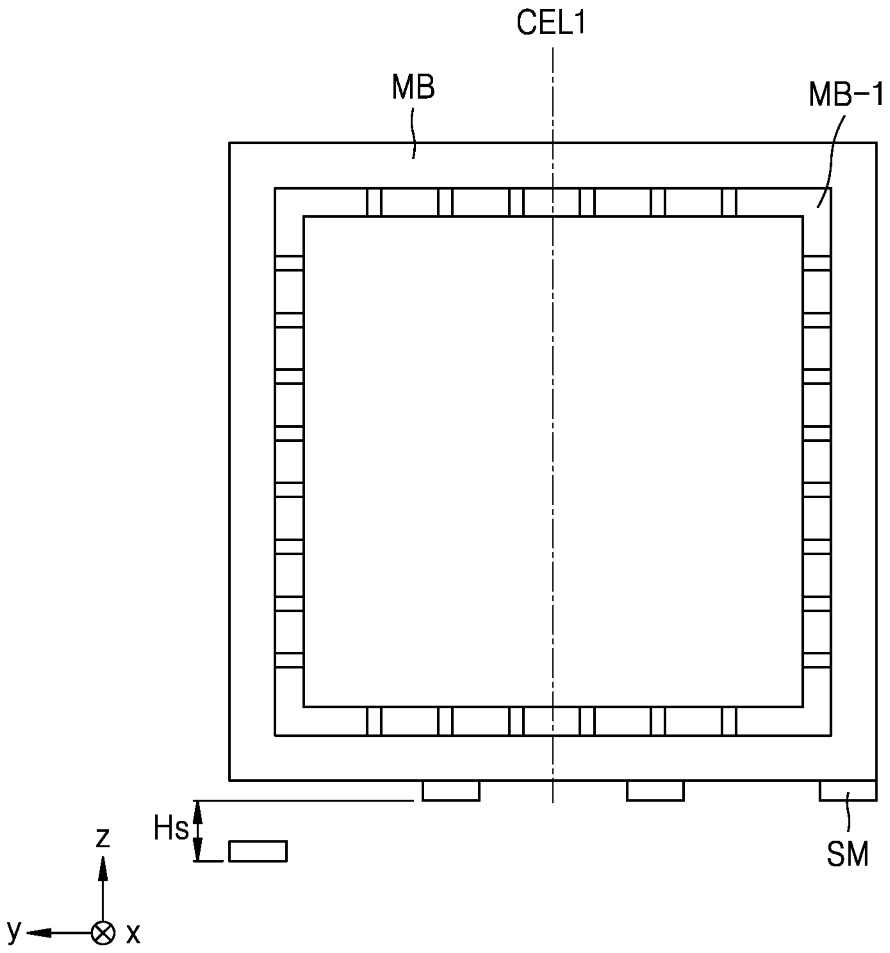
FIGS. 9A and 9B are schematic front views illustrating states in which a conventional mask frame and a mask frame according to embodiments are seated on manufacturing stages.
Figure 9B:
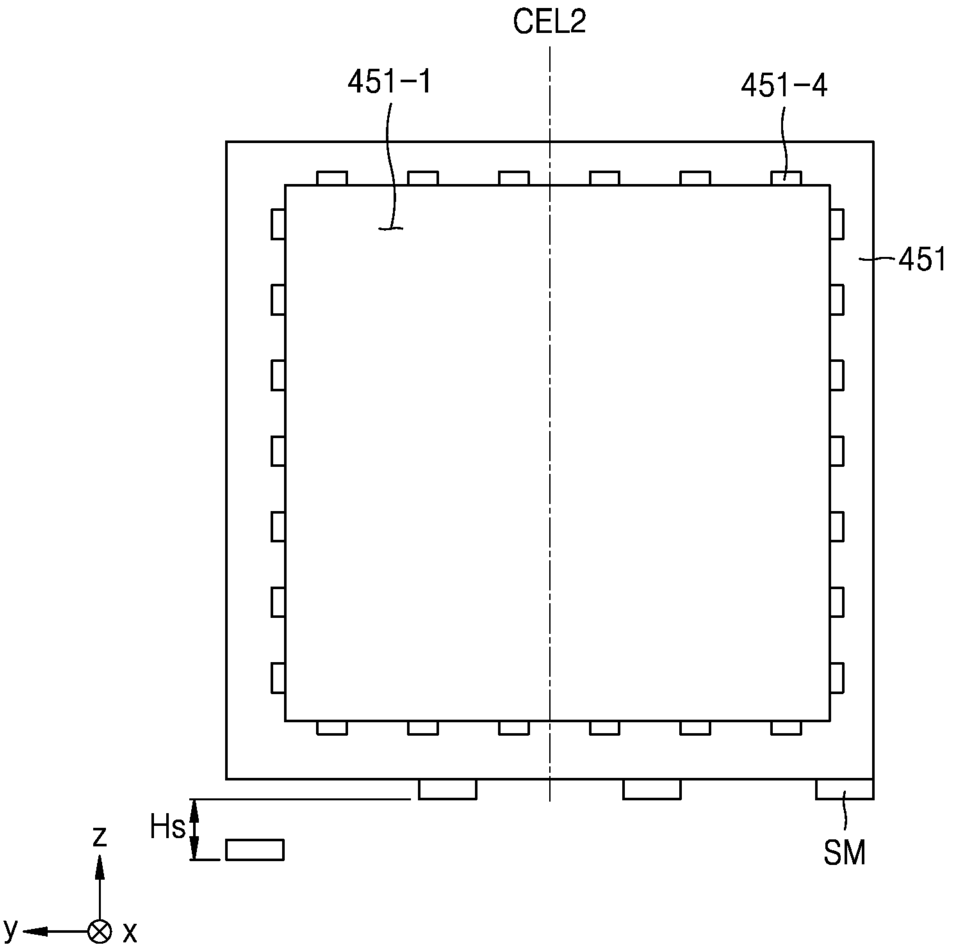

FIGS. 9A and 9B are schematic front views illustrating states in which a conventional mask frame MB and a mask frame 451 according to embodiments are seated on manufacturing stages, respectively.

Referring to FIGS. 9A and 9B, each of the conventional mask frame MB and the mask frame 451 according to embodiments may be disposed on a stage block SM of a manufacturing stage. Different from the example shown in FIGS. 8A and 8B, one of the plurality of stage blocks SM may be disposed at a higher position than the other one of the plurality of stage blocks SM. For example, one of the plurality of stage blocks SM may be disposed at a position that is higher than that of the other one of the plurality of stage blocks SM by a distance Hs.

In this case, whether a specific position of the conventional mask frame MB and a specific position of the mask frame 451 according to embodiments are changed may be measured. For example, a point at which the degree of deformation of each mask frame is measured may be a center line of the corresponding mask frame.

In the example shown in FIGS. 9A and 9B, the degree of change in the position of the first center line CEL1 of the conventional mask frame MB may be 49.7 μm in the right direction based on the initial position of the first center line CEL1, and the degree of change in the position of the second center line CEL2 of the mask frame 451 according to embodiments may be 5.3 μm in the left direction based on the initial position of the second center line CEL2. Accordingly, the degree of deformation of the mask frame 451 according to embodiments may be less than that of the conventional mask frame MB.

Therefore, when the second surface of the mask frame 451, on which the mask assembly 450 contacts the mask sheet 453, is formed to be flat as described above, the mask frame 451 may be deformed less than the conventional mask frame MB, thereby reducing deformation of the mask assembly 450 itself.

Figure 10:
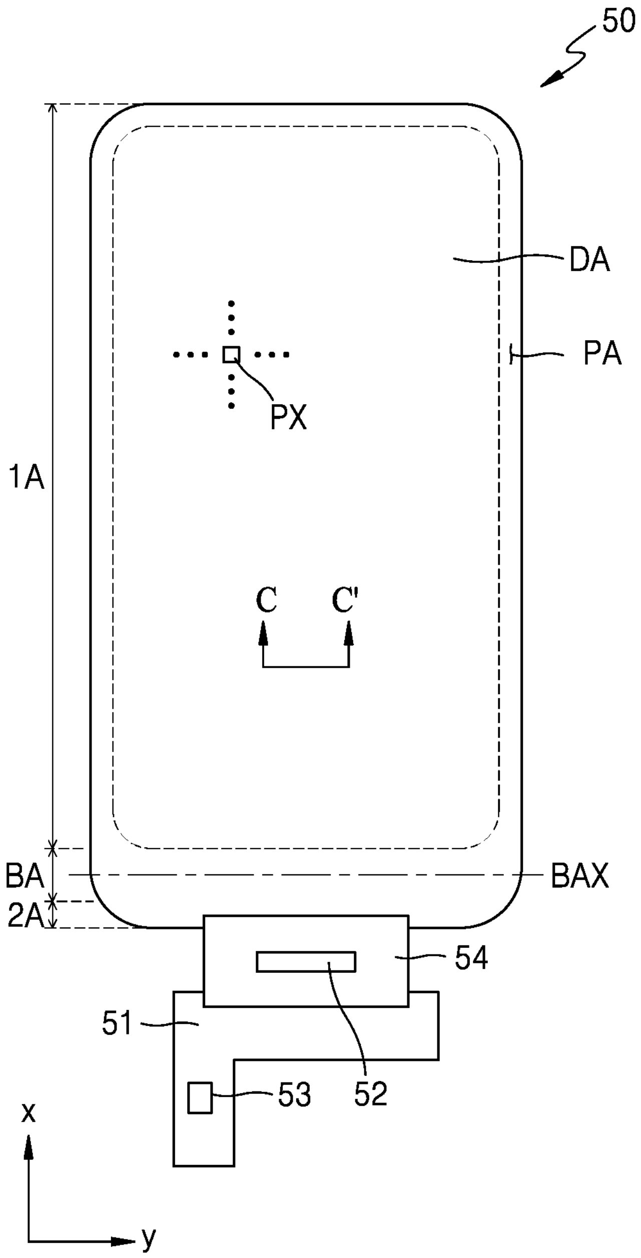
FIG. 10 is a schematic plan view of a display device according to an embodiment.

FIG. 10 is a schematic plan view of a display device 50 according to an embodiment.

Referring to FIG. 10, in an embodiment, the display device 50 has a display area DA and a peripheral area PA. Display elements (e.g., a plurality of pixels) may be arranged in the display area DA of the display device 50 to display images while display elements are not arranged in the peripheral area PA of the display device 50, and thus, images may not be displayed in the peripheral area PA. The display elements may be a plurality of pixels PX. The plurality of pixels PX may be arranged in the display area DA to be spaced apart from each other. In an embodiment, some (a first group) of the plurality of pixels PX, some others (a second group) of the plurality of pixels PX, and some others (a third group) of the plurality of pixels PX may emit light of different colors. In another embodiment, all of the plurality of pixels PX may emit light of the same color.

The display device 50 may have a first area 1A including the display area DA, a portion of the peripheral area PA arranged adjacent to the display area DA, and a bending area BA including a bending axis BAX that is bent while being arranged in the peripheral area PA and a second area 2A connected to (or extending from) the bending area BA and arranged in the peripheral area PA. Terminals may be arranged in the second area 2A. The first area 1A may be an area that maintains a flat state or is folded.

In an embodiment, the display device 50 may include display elements. The display elements may be a light-emitting display device including a light-emitting diode (LED). In an embodiment, the display device 50 may be an organic light-emitting display device using an organic LED including an organic emission layer, a micro light-emitting display device using a micro LED, a quantum dot light-emitting display device using a quantum dot LED including a quantum dot emission layer, or an inorganic light-emitting display device using an inorganic light-emitting element including an inorganic semiconductor.

In an embodiment, the display device 50 may be a rigid display device that is difficult to bend due to its rigidity or may be a flexible display device that is bendable, foldable, or rollable due to its flexibility. For example, the display device 50 may be a foldable display device, a curved display device with a curved display surface, a bendable display device in which areas other than a display surface are bent, a rollable display device, or a stretchable display device.

The display device 50 may be transparent so that an object or background under (or behind) the display device 50 may be seen from above (or in front of) the display device 50. In another embodiment, the display device 50 may include a reflective display device that may reflect an object or background above (or in front of) the display device 50.

In an embodiment, a first flexible film 54 may be bonded to one edge of the display device 50. One side of the first flexible film 54 may be bonded to one edge of the display device 50 via an anisotropic conductive film. The first flexible film 54 may be a bendable flexible film.

In an embodiment, a display driver 52 may be disposed on the first flexible film 54. The display driver 52 may be configured to receive control signals and power supply voltages and to generate and output signals and voltages for driving the display device 50. The display driver 52 may be implemented as an integrated circuit (IC).

In an embodiment, a display circuit board 51 may be bonded to the other side of the first flexible film 54. The other side of the first flexible film 54 may be bonded to the upper surface of the display circuit board 51 via an anisotropic conductive film. The display circuit board 51 may be a flexible printed circuit board (FPCB) that is easily bendable, a rigid printed circuit board (PCB) that is rigid and thus hardly bendable, or a composite printed circuit board that includes both the rigid PCB and the FPCB.

In an embodiment, a touch sensor driver 53 may be disposed on the display circuit board 51. The touch sensor driver 53 may be implemented as an IC. The touch sensor driver 53 may be bonded on the display circuit board 51. The touch sensor driver 53 may be electrically connected through the display circuit board 51 to touch electrodes of a touch screen layer of the display device 50.

The touch screen layer of the display device 50 may be configured to sense a touch input of a user by using at least one of various touch methods, including a resistive method and a capacitive method. For example, when the touch screen layer of the display device 50 senses a touch input of a user by using a capacitive method, the touch sensor driver 53 may determine the touch or non-touch of the user by applying driving signals to driving electrodes from among the touch electrodes and sensing voltages charged in mutual capacitances between the driving electrodes and sensing electrodes through the sensing electrodes from among the touch electrodes. The touch of the user may include a contact touch and a proximity touch (or proximity event). The contact touch refers to direct contact of a user's finger or an object, such as a pen, with a cover member disposed on the touch screen layer. The proximity touch indicates that a user's finger or an object, such as a pen, is located near to but apart from the cover member, such as hovering. The touch sensor driver 53 may be configured to transmit sensor data to a main processor according to the sensed voltages, and the main processor may be configured to analyze the sensor data and to calculate touch coordinates at where the touch input has occurred.

A power supply configured to supply driving voltages for driving the pixels PX, the scan driver, and the display driver 52 of the display device 50 may be additionally disposed on the display circuit board 51. In some embodiments, the power supply may be integrated with the display driver 52. In such an embodiment, the display driver 52 and the power supply may be formed as a single IC.

Figure 11:
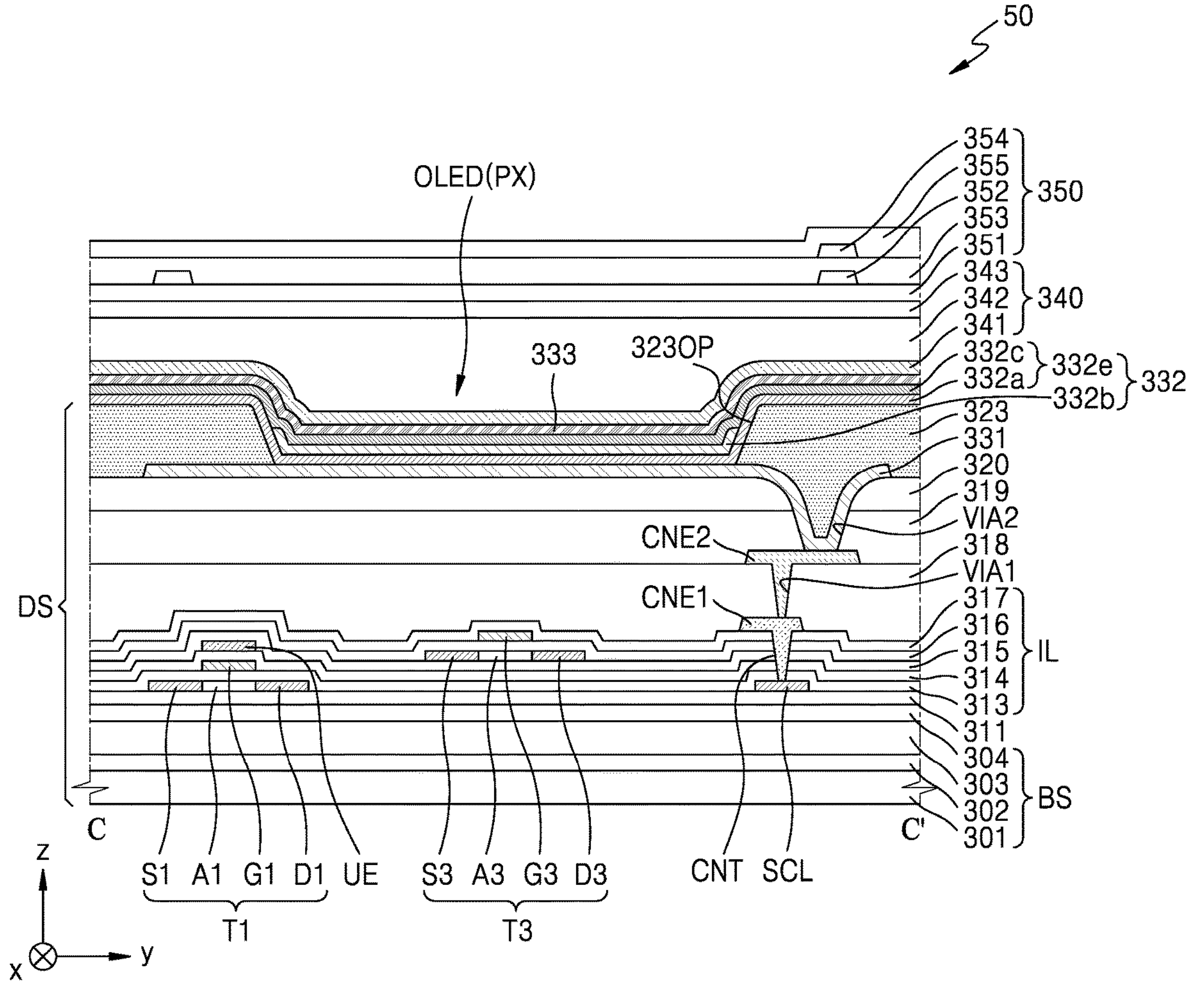
FIG. 11 is a cross-sectional view of the display device shown in FIG. 10 taken along the line C-C' in FIG. 10.

FIG. 11 is a cross-sectional view of the display device 50 taken along the line C-C' in FIG. 10.

Referring to FIG. 11, the display device 50 may include a substrate BS, a buffer layer 311, insulating layers IL, a light-emitting element OLED, a thin-film encapsulation layer 340, and an input sensor 350.

The substrate BS may have a structure in which layers including organic materials and layers including inorganic materials are alternately stacked. For example, the substrate BS may include a first base layer 301, a first barrier layer 302, a second base layer 303, and a second barrier layer 304, which are sequentially stacked in this order.

The first base layer 301 may include an organic material. For example, the first base layer 301 may include one of polyimide, polyethylene naphthalate, polyethylene terephthalate, polyarylate, polycarbonate, polyetherimide, and polyethersulfone.

The first barrier layer 302 may be disposed on the first base layer 301. The first barrier layer 302 may include an inorganic material. For example, the first barrier layer 302 may include silicon oxide, silicon oxynitride, silicon nitride, amorphous silicon, or the like. In an embodiment, the first barrier layer 302 may include a first layer and a second layer, and the second layer may have a refractive index lower than a refractive index of the first layer. For example, the first layer may include silicon oxynitride, and the second layer may include silicon oxide having a refractive index lower than a refractive index of silicon oxynitride.

The second base layer 303 may be disposed on the first barrier layer 302. The second base layer 303 may include the same material as that of the first base layer 301. However, the disclosure is not limited thereto, and in some embodiments, the second base layer 303 may include a material different from that of the first base layer 301. In an embodiment, a thickness of the second base layer 303 may be less than a thickness of the first base layer 301.

The second barrier layer 304 may be disposed on the second base layer 303. The second barrier layer 304 may include an inorganic material. For example, the second barrier layer 304 may include silicon oxide, silicon oxynitride, silicon nitride, or the like. In an embodiment, the second barrier layer 304 may include a first layer and a second layer, and the second layer may have a refractive index lower than a refractive index of the first layer. For example, the first layer may include silicon oxynitride, and the second layer may include silicon oxide having a refractive index lower than a refractive index of silicon oxynitride.

The buffer layer 311 may be disposed on the substrate BS. The buffer layer 311 may reduce or block infiltration of foreign material, moisture, or ambient air from below the substrate BS. The buffer layer 311 may include an inorganic material, such as silicon oxide, silicon oxynitride, or silicon nitride, and may include a single layer or layers including the material described above.

A semiconductor pattern may be disposed on the buffer layer 311. Hereinafter, a semiconductor pattern disposed directly on the buffer layer 311 is defined as a first semiconductor pattern. The first semiconductor pattern may include a silicon semiconductor. The first semiconductor pattern may include polysilicon. However, the disclosure is not limited thereto, and in some embodiments, the first semiconductor pattern may include amorphous silicon.

FIG. 11 only shows a portion of the first semiconductor pattern, and another first semiconductor pattern may be further arranged in another region of the pixel PX (see, e.g., FIG. 10). The first semiconductor pattern may include a doping area and a non-doping area. The doping area may be doped with an N-type dopant or a P-type dopant. A P-type transistor may include the doping area doped with the P-type dopant.

A first transistor T1 may have a source area S1, an active area A1, and a drain area D1. The source area S1, the active area A1, and the drain area D1 of the first transistor T1 may be formed in pattern shape in a first semiconductor. The source area S1 and the drain area D1 of the first transistor T1 may be spaced apart from each other with the active area A1 of the first transistor T1 therebetween.

A connecting signal line SCL may be further disposed on the buffer layer 311. The connecting signal line SCL may be connected to a drain area D6 of the sixth transistor T6 (see, e.g., FIG. 12) in a plan view. However, in some embodiments, the connecting signal line SCL may be omitted.

A first insulating layer 313 may be disposed on the buffer layer 311. The first insulating layer 313 may cover the first semiconductor pattern. In an embodiment, the first insulating layer 313 may include an inorganic material, such as silicon oxide, silicon oxynitride, or silicon nitride, and may include a single layer or a plurality of layers including the material described above.

A gate G1 of the first transistor T1 may be disposed on the first insulating layer 313. The gate G1 of the first transistor T1 may be a portion of a metal pattern. The gate G1 of the first transistor T1 may at least partially overlap the first semiconductor pattern disposed therebelow. For example, the gate G1 of the first transistor T1 may overlap the active area A1 disposed therebelow. The gate G1 of the first transistor T1 may include a low-resistance conductive material, such as molybdenum (Mo), aluminum (Al), copper (Cu), and/or titanium (Ti), and may include a single layer or a plurality of layers including the material described above.

A second insulating layer 314 may be disposed on the first insulating layer 313. The second insulating layer 314 may cover the gate G1 of the first transistor T1 disposed on the first insulating layer 313. The second insulating layer 314 may include an inorganic material, such as silicon oxide, silicon oxynitride, or silicon nitride, and may include a single layer or a plurality of layers including the material described above.

An upper electrode UE may be disposed on the second insulating layer 314. The upper electrode UE may at least partially overlap the gate G1 of the first transistor T1 disposed therebelow. The upper electrode UE may be a portion of a metal pattern or a portion of a doped semiconductor pattern. A portion of the gate G1 and the upper electrode UE overlapping a portion of the gate G1 may constitute a first storage capacitor Cst (see, e.g., FIG. 12). However, in some embodiments, the upper electrode UE may be omitted.

A first electrode CE1 (see, e.g., FIG. 12) and a second electrode CE2 (see, e.g., FIG. 12) of the first storage capacitor Cst may be formed through the same process as the gate G1 and the upper electrode UE, respectively. The first electrode CE1 may be disposed on the first insulating layer 313, and the first electrode CE1 may be electrically connected to the gate G1. The first electrode CE1 may be integral with the gate G1.

A third insulating layer 315 may be disposed on the second insulating layer 314. The third insulating layer 315 may cover the upper electrode UE disposed on the second insulating layer 314. The third insulating layer 315 may include an inorganic material, such as silicon oxide, silicon oxynitride, or silicon nitride, and may include a single layer or a plurality of layers including the material described above. In an embodiment, the third insulating layer 315 may include a plurality of silicon oxide layers and a plurality of silicon nitride layers, which are alternately stacked.

Source areas S2, S5, S6, and S7 (see, e.g., FIG. 12), drain areas D2, D5, D6, and D7 (see, e.g., FIG. 12), and gates G2, G5, G6, and G7 (see, e.g., FIG. 1012 of second, fifth, sixth, and seventh transistors T2, T5, T6, and T7 (see, e.g., FIG. 12) may be formed through the same process as the source area S1, the drain area D1, and the gate G1 of the first transistor T1.

A semiconductor pattern may be disposed on the third insulating layer 315. Hereinafter, the semiconductor pattern disposed directly on the third insulating layer 315 is defined as a second semiconductor pattern. The second semiconductor pattern may include an oxide semiconductor. The oxide semiconductor may include a crystalline or amorphous oxide semiconductor.

For example, the oxide semiconductor may include at least one selected from indium (In), gallium (Ga), tin (Sn), zirconium (Zr), vanadium (V), hafnium (Hf), cadmium (Cd), germanium (Ge), chromium (Cr), titanium (Ti), and zinc (Zn). In some embodiments, the oxide semiconductor may include indium tin oxide (ITO), indium gallium zinc oxide (IGZO), zinc oxide (ZnO), indium zinc oxide (IZO), zinc indium oxide (ZIO), indium oxide (InO), titanium oxide (TiO), indium zinc tin oxide (IZTO), zinc tin oxide (ZTO), and the like.

A third transistor T3 may have a source area S3, an active area A3, and a drain area D3. The source area S3, the active area A3, and the drain area D3 of the third transistor T3 may be formed in a pattern shape in a second semiconductor. The source area S3 and the drain area D3 of the third transistor T3 may include a metal reduced from a metal oxide semiconductor. The source area S3 and the drain area D3 of the third transistor T3 may include a metal layer that includes a reduced metal and has a thickness from the upper surface of the second semiconductor pattern.

A fourth insulating layer 316 may be disposed on the third insulating layer 315. The fourth insulating layer 316 may cover the second semiconductor pattern disposed on the third insulating layer 315. In an embodiment, the fourth insulating layer 316 may include an inorganic material, such as silicon oxide, silicon oxynitride, or silicon nitride, and may include a single layer or a plurality of layers including the material described above.

In an embodiment, the fourth insulating layer 316 may be patterned to correspond to a gate G3 of the third transistor T3 disposed thereon. For example, the gate G3 of the third transistor T3 and the fourth insulating layer 316 may have the same shape in a plan view.

The gate G3 of the third transistor T3 may be disposed on the fourth insulating layer 316. The gate G3 of the third transistor T3 may be a portion of a metal pattern. The gate G3 of the third transistor T3 may at least partially overlap the second semiconductor pattern disposed therebelow. For example, the gate G3 of the third transistor T3 may overlap the active area A3 disposed therebelow. The gate G3 of the third transistor T3 may include a low-resistance conductive material, such as molybdenum (Mo), aluminum (Al), copper (Cu), and/or titanium (Ti), and may include a single layer or a plurality of layers including the material described above.

A fifth insulating layer 317 may be disposed on the fourth insulating layer 316. The fifth insulating layer 317 may cover the gate G3 disposed on the fourth insulating layer 316. In an embodiment, the fifth insulating layer 317 may include an inorganic material, such as silicon oxide, silicon oxynitride, or silicon nitride, and may include a single layer or a plurality of layers including the material described above. In an embodiment, the fifth insulating layer 317 may include a plurality of silicon oxide layers and a plurality of silicon nitride layers, which are alternately stacked.

A source area S4 (see, e.g., FIG. 12), a drain area D4 (see, e.g., FIG. 12), and a gate G4 (see, e.g., FIG. 12) of a fourth transistor T4 (see, e.g., FIG. 12) may be formed through the same process as the source area S3, the drain area D3, and the gate G3 of the third transistor T3.

The first to fifth insulating layers 313 to 317 may be collectively referred to as the insulating layers IL. However, at least one of the first to fifth insulating layers 313 to 317 may be omitted.

At least one organic insulating layer may be disposed on the fifth insulating layer 317. In an embodiment, a first organic insulating layer 318, a second organic insulating layer 319, and a third organic insulating layer 320 may be disposed on the fifth insulating layer 317. The first organic insulating layer 318, the second organic insulating layer 319, and the third organic insulating layer 320 may each be a single polyimide-based resin layer. However, the disclosure is not limited thereto. In some embodiments, the first organic insulating layer 318, the second organic insulating layer 319, and the third organic insulating layer 320 may each include at least one selected from acrylic resin, methacrylic resin, polyisoprene-based resin, vinyl-based resin, epoxy-based resin, urethane-based resin, cellulose-based resin, siloxane-based resin, polyimide-based resin, and perylene-based resin.

A first connection electrode CNE1 may be disposed on the fifth insulating layer 317. The first connection electrode CNE1 may be connected to the connecting signal line SCL through contact holes (e.g., contact openings) CNT defined in the first to fifth insulating layers 313 to 317.

A second connection electrode CNE2 may be disposed on the first organic insulating layer 318. The second connection electrode CNE2 may be connected to the first connection electrode CNE1 through a first via hole (e.g., a first via opening) VIA1 defined in the first organic insulating layer 318.

A light-emitting element OLED, which is a display element, may be disposed on the third organic insulating layer 320. In such an embodiment, a plurality of light-emitting elements OLED may be provided to be spaced apart from each other. The light-emitting element OLED may include a pixel electrode 331, an intermediate layer 332, and an opposite electrode 333. The pixel electrode 331 may be disposed on the third organic insulating layer 320. Also, a pixel defining layer 323 may be disposed on the third organic insulating layer 320.

The pixel electrode 331 may be disposed on the third organic insulating layer 320. The pixel electrode 331 may be electrically connected to the second connection electrode CNE2 through a second via hole (e.g., a second via opening) VIA2 defined in the second organic insulating layer 319 and the third organic insulating layer 320. The pixel electrode 331 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In an embodiment, the pixel electrode 331 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. In an embodiment, the pixel electrode 331 may further include a layer including ITO, IZO, ZnO, or $In_2O_3$ above and/or below the reflective layer. For example, the pixel electrode 331 may have a multilayer structure of ITO/Ag/ITO.

The pixel defining layer 323 having an opening 323OP exposing at least a portion of the pixel electrode 331 may be disposed on the pixel electrode 331. The opening 323OP in the pixel defining layer 323 may define an emission area of light emitted from the light-emitting element OLED. For example, the width of the opening 323OP may correspond to the width of the emission area. A non-emission area may be at a periphery of the emission area, and the non-emission area may surround (e.g., may surround in a plan view or extend around a periphery of) the emission area.

The pixel defining layer 323 may include an organic insulating material. In some embodiments, the pixel defining layer 323 may include an inorganic insulating material, such as silicon nitride, silicon oxynitride, or silicon oxide. In some embodiments, the pixel defining layer 323 may include an organic insulating material and an inorganic insulating material. In some embodiments, the pixel defining layer 323 may include a light blocking material and may be provided in black. The light blocking material may include a resin or paste including carbon black, carbon nanotubes or black dye, metal particles (e.g., nickel, aluminum, molybdenum, and any alloy thereof), metal oxide particles (e.g., chromium oxide), or metal nitride particles (e.g., chromium nitride). When the pixel defining layer 323 includes a light blocking material, the reflection of external light due to the metal structures below the pixel defining layer 323 may be reduced.

A spacer may be disposed on the pixel defining layer 323. The spacer may include an organic insulating material, such as polyimide. In some embodiments, the spacer may include an inorganic insulating material, such as silicon nitride ($SiN_x$) or silicon oxide ($SiO_x$), or may include an organic insulating material and an inorganic insulating material.

In an embodiment, the spacer may include the same material as that of the pixel defining layer 323. In such an embodiment, the pixel defining layer 323 and the spacer may be formed together (e.g., may be formed concurrently) in a mask process by using a halftone mask or the like. In an embodiment, the spacer and the pixel defining layer 323 may include different materials from each other.

The intermediate layer 332 may be disposed on the pixel electrode 331. The intermediate layer 332 may include a first functional layer 332*a*, an emission layer 332*b*, and a second functional layer 332*c*, which are sequentially stacked in this stated order. The first functional layer 332*a* and the second functional layer 332*c* may be collectively referred to as an organic functional layer 332*e*.

The emission layer 332*b* may be disposed in the opening 323OP in the pixel defining layer 323. The emission layer 332*b* may include a high molecular weight organic material or a low molecular weight organic material that emits light of a certain color. In such an embodiment, the light-emitting elements OLED may emit light of different colors from each other according to the type of material of the emission layer 332*b*. The emission layers 332*b* may be spaced apart from each other and may have a certain pattern. Also, some of the emission layers 332*b*, others of the emission layers 332*b*, and others of the emission layers 332*b* may include different materials from each other.

The organic functional layer 332*e* may include a first functional layer 332*a* between the pixel electrode 331 and the emission layer 332*b*, and a second functional layer 332*c* between the emission layer 332*b* and the opposite electrode 333. For example, the first functional layer 332*a* may be between the pixel electrode 331 and the emission layer 332*b*, and the second functional layer 332*c* may be omitted between the emission layer 332*b* and the opposite electrode 333. In an embodiment, the first functional layer 332*a* may be omitted between the pixel electrode 331 and the emission layer 332*b*, and the second functional layer 332*c* may be between the emission layer 332*b* and the opposite electrode 333. In an embodiment, the first functional layer 332*a* may be between the pixel electrode 331 and the emission layer 332*b*, and the second functional layer 332*c* may be between the emission layer 332*b* and the opposite electrode 333. Hereinafter, an embodiment in which the first functional layer 332*a* and the second functional layer 332*c* are disposed will be described in detail.

The first functional layer 332*a* may include, for example, a hole transport layer (HTL), or may include an HTL and a hole injection layer (HIL). The second functional layer 332*c* may include an electron transport layer (ETL) and/or an electron injection layer (EIL). The first functional layer 332*a* and/or the second functional layer 332*c* may be a common layer completely covering the substrate BS.

At least one of the first functional layer 332*a*, the emission layer 332*b*, and the second functional layer 332*c* may be formed in the form of a pattern. For example, at least one of the first functional layer 332*a*, the emission layer 332*b*, and the second functional layer 332*c* is provided in plurality. At least one of the first functional layers 332*a*, the emission layers 332*b*, and the second functional layers 332*c* may be spaced apart from each other to correspond to each light-emitting element OLED. Hereinafter, for convenience of explanation, an embodiment in which the first functional layer 332*a* and the second functional layer 332*c* are on the front surface of the substrate BS and the emission layers 332*b* are spaced apart from each other will be described in detail.

The opposite electrode 333 may include a conductive material having a low work function. For example, the opposite electrode 333 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. In some embodiments, the opposite electrode 333 may further include a layer including ITO, IZO, ZnO, or $In_2O_3$ on the (semi)transparent layer including the material described above.

A capping layer may be further disposed on the opposite electrode 333. The capping layer may include an inorganic material, such as lithium fluoride (LiF), and/or an organic material.

An encapsulation member may be disposed on the light-emitting element OLED. The encapsulation member may include a thin-film encapsulation layer 340. An embodiment in which the thin-film encapsulation layer 340 is provided as the encapsulation member is illustrated, but the disclosure is not limited thereto. For example, the encapsulation member may include an encapsulation substrate and a sealing portion connecting the encapsulation substrate to the substrate.

The thin-film encapsulation layer 340 may include at least one inorganic layer and at least one organic layer. For example, the thin-film encapsulation layer 340 may include a first inorganic layer 341, an organic layer 342, and a second inorganic layer 343, which are sequentially stacked in this order.

The first inorganic layer 341 may be disposed directly on the opposite electrode 333. The first inorganic layer 341 may prevent or minimize infiltration of external moisture or oxygen into the light-emitting element OLED.

The organic layer 342 may be disposed directly on the first inorganic layer 341. The organic layer 342 may provide a flat surface on the first inorganic layer 341. Because curves or particles formed on the upper surface of the first inorganic layer 341 are covered by the organic layer 342, the influence of the surface state of the upper surface of the first inorganic layer 341 on the components formed on the organic layer 342 may be reduced or blocked.

The second inorganic layer 343 may be disposed directly on organic layer 342. The second inorganic layer 343 may prevent or minimize release of moisture from the organic layer 342 to the outside.

The first inorganic layer 341 and the second inorganic layer 343 may include at least one inorganic material selected from aluminum oxide, titanium oxide, tantalum oxide, hafnium oxide, zinc oxide, silicon oxide, silicon nitride, and silicon oxynitride. The first inorganic layer 341 and the second inorganic layer 343 may be a single layer or a plurality of layers including the material described above. The organic layer 342 may include a polymer-based material. The polymer-based material may include acrylic resin, epoxy-based resin, polyimide, polyethylene, and the like. In an embodiment, the organic layer 342 may include acrylate.

The input sensor 350 may be disposed on the encapsulation member. The input sensor 350 may include a plurality of conductive patterns 352 and 354, a first sensing insulating layer 351, a second sensing insulating layer 353, and a third sensing insulating layer 355.

The first sensing insulating layer 351 may be disposed on the encapsulation member. The first conductive patterns 352 may be disposed on the first sensing insulating layer 351 and may be covered by the second sensing insulating layer 353. Also, the second conductive patterns 354 may be disposed on the second sensing insulating layer 353 and may be covered by the third sensing insulating layer 355. The first sensing insulating layer 351, the second sensing insulating layer 353, and the third sensing insulating layer 355 may each include an inorganic material and/or an organic material.

The conductive patterns 352 and 354 may each be conductive. The conductive patterns 352 and 354 may each be provided as a single layer or a plurality of layers. Also, at least one of the conductive patterns 352 and 354 may be provided as mesh lines in a plan view.

The mesh lines constituting the conductive patterns 352 and 354 may not overlap the emission layer 332*b* in a plan view. Accordingly, even when the input sensor 350 is formed directly on the display device 50, light emitted from pixels PX of a display panel may be provided to a user without interference from the input sensor 350.

Figure 12:
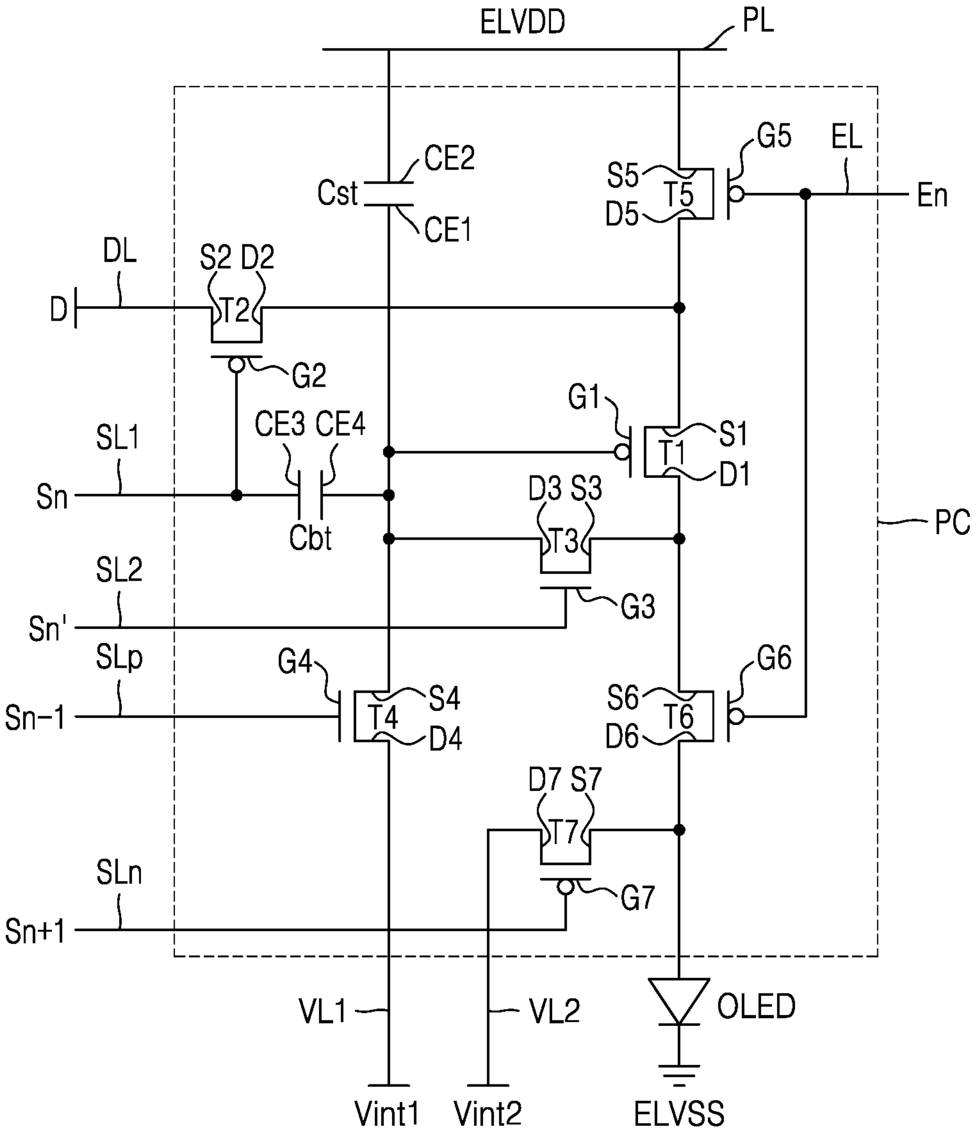
FIG. 12 is an equivalent circuit diagram of a pixel of the display device shown in FIG. 10.

FIG. 12 is an equivalent circuit diagram schematically illustrated the pixel of the display device shown in FIG. 10.

Referring to FIG. 12, in an embodiment, a pixel circuit PC may include a first transistor T1, a second transistor T2, a third transistor T3, a fourth transistor T4, a fifth transistor T5, a sixth transistor T6, a seventh transistor T7, a first storage capacitor Cst, and a second storage capacitor Cbt. In an embodiment, at least one of the first to seventh transistors T1 to T7 may be omitted.

The first to seventh transistors T1, T2, T3, T4, T5, T6, and T7 and the first and second storage capacitors Cst and Cbt may be connected to signal lines, a first initialization voltage line VL1, a second initialization voltage line VL2, and a driving voltage line PL. The signal lines may include a data line DL, a first scan line SL1, a second scan line SL2, a previous scan line SLp, a next scan line SLn, and an emission control line EL. In an embodiment, the signal lines, the first and second initialization voltage lines VL1 and VL2, and/or the driving voltage line PL may be shared by neighboring pixels.

The driving voltage line PL may be configured to transmit a first driving voltage ELVDD to the first transistor T1. The first initialization voltage line VL1 may be configured to transmit, to the pixel circuit PC, a first initialization voltage Vint1 for initializing the first transistor T1. The second initialization voltage line VL2 may be configured to transmit, to the pixel circuit PC, a second initialization voltage Vint2 for initializing the light-emitting element OLED.

From among the first to seventh transistors T1 to T7, the third and fourth transistors T3 and T4 may be implemented as n-channel metal-oxide semiconductor field effect transistor (MOSFET) (NMOS), and the others may be implemented as p-channel MOSFET (PMOS). However, the disclosure is not limited thereto. In an embodiment, the third transistor T3, the fourth transistor T4, and the seventh transistor T7 may be implemented as NMOS, and the others may be implemented as PMOS.

As used herein, the expression "a transistor and a signal line, or a transistor and a transistor are electrically connected to each other" means "a source, a drain, and a gate of a transistor are integral with a signal line or are connected to each other through a connection electrode."

The first transistor T1 may be configured to control the magnitude of a driving current flowing from the driving voltage line PL to the light-emitting element OLED according to a gate voltage. The first transistor T1 may include a gate G1 connected to a first electrode CE1 of the first storage capacitor Cst, and a source area S1 connected to the driving voltage line PL through the fifth transistor T5. Also, the first transistor T1 may include a drain area D1 connected to the light-emitting element OLED through the sixth transistor T6.

The second transistor T2 may be configured to receive a data voltage D in response to a first scan signal Sn. The second transistor T2 may be configured to transmit the data voltage D to the source area S1 of the first transistor T1 in response to the first scan signal Sn. The second transistor T2 may include a gate G2 connected to the first scan line SL1, a source area S2 connected to the data line DL, and a drain area D2 connected to the source area S1 of the first transistor T1.

The first storage capacitor Cst may be connected between the driving voltage line PL and the first transistor T1. The first storage capacitor Cst may include a second electrode CE2 connected to the driving voltage line PL, and the first electrode CE1 connected to the gate G1 of the first transistor T1. The first storage capacitor Cst may be configured to store the difference between the first driving voltage ELVDD applied to the driving voltage line PL and the gate voltage of the first transistor T1 and to maintain the gate voltage of the first transistor T1.

The third transistor T3 may be connected in series between the drain area D1 and the gate G1 of the first transistor T1 and may connect the drain area D1 and the gate G1 of the first transistor T1 to each other in response to a second scan signal Sn'. The third transistor T3 may include a gate G3 connected to the second scan line SL2, a source area S3 connected to the drain area D1 of the first transistor T1, and a drain area D3 connected to the gate G1 of the first transistor T1. The third transistor T3 may include a plurality of transistors that are connected in series to each other and are concurrently (or simultaneously) controlled by the second scan signal Sn'. However, the third transistor T3 may be omitted.

When the third transistor T3 is turned on in response to the second scan signal Sn', the drain area D1 and the gate G1 of the first transistor T1 are connected to each other. That is, the first transistor T1 is diode-connected.

The fourth transistor T4 may be configured to apply the first initialization voltage Vint1 to the gate G1 of the first transistor T1 in response to a previous scan signal Sn−1. The fourth transistor T4 may include a gate G4 connected to the previous scan line SLp, a source area S4 connected to the gate G1 of the first transistor T1, and a drain area D4 connected to the first initialization voltage line VL1. The fourth transistor T4 may include a plurality of transistors that are connected in series to each other and are concurrently (e.g., simultaneously) controlled by the previous scan signal Sn−1. However, in some embodiments, the fourth transistor T4 may be omitted.

The fifth transistor T5 may connect the driving voltage line PL to the source area S1 of the first transistor T1 in response to an emission control signal En. The fifth transistor T5 may include a gate G5 connected to the emission control line EL, a source area S5 connected to the driving voltage line PL, and a drain area D5 connected to the source area S1 of the first transistor T1. However, in some embodiments, the fifth transistor T5 may be omitted.

The sixth transistor T6 may connect the drain area D1 of the first transistor T1 to an anode of the light-emitting element OLED in response to the emission control signal En. The sixth transistor T6 may be configured to transmit the driving current output from the first transistor T1 to the anode of the light-emitting element OLED. The sixth transistor T6 may include a gate G6 connected to the emission control line EL, a source area S6 connected to the drain area D1 of the first transistor T1, and a drain area D6 connected to the anode of the light-emitting element OLED. However, in some embodiments, the sixth transistor T6 may be omitted.

The seventh transistor T7 may be configured to apply the second initialization voltage Vint2 to the anode of the light-emitting element OLED in response to a next scan signal Sn+1. The seventh transistor T7 may include a gate G7 connected to the next scan line SLn, a source area S7 connected to the anode of the light-emitting element OLED, and a drain area D7 connected to the second initialization voltage line VL2. However, in some embodiments, the seventh transistor T7 may be omitted. The cathode of the light emitting element OLED may receive a second driving voltage or common voltage ELVSS.

As illustrated in FIG. 12, the seventh transistor T7 may be connected to the next scan line SLn. In other embodiments, the seventh transistor T7 may be connected to the emission control line EL and driven in response to the emission control signal En. In other embodiments, the seventh transistor T7 may be connected to the previous scan line SLp and driven in response to the previous scan signal Sn−1.

The positions of the sources and the drains may be changed with each other according to the type of transistor (p-type or n-type).

The second storage capacitor Cbt may include a third electrode CE3 and a fourth electrode CE4. The fourth electrode CE4 of the second storage capacitor Cbt may be connected to the first electrode CE1 of the first storage capacitor Cst, and the third electrode CE3 of the second storage capacitor Cbt may be configured to receive the first scan signal Sn. The second storage capacitor Cbt may be configured to compensate for the voltage drop at the gate G1 of the first transistor T1 by increasing the voltage of the gate G1 of the first transistor T1 at the time when the supply of the first scan signal Sn is stopped. However, in some embodiments, the second storage capacitor Cbt may be omitted.

The apparatus for manufacturing a display device and the method of manufacturing a display device according to embodiments of the present disclosure may manufacture a display device having a precise pattern. The apparatus for manufacturing a display device and the method of manufacturing a display device according to embodiments of the present disclosure may reduce or minimize deformation of the mask assembly during the manufacturing of the display device.

It should be understood that the embodiments described herein should be considered in a descriptive sense and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims and their equivalents.

What is claimed is:

1. An apparatus for manufacturing a display device, the apparatus comprising:
- a mask assembly tilted with respect to the gravitational direction;
- a deposition source facing the mask assembly; and
- a carrier facing the mask assembly and configured to support a display substrate,
- wherein the mask assembly comprises:
  - a mask frame having a flat surface; and
  - a mask sheet having an end on the flat surface of the mask frame and coupled to the mask frame, and
- wherein the deposition source comprises:
  - a source portion configured to accommodate and heat a deposition material; and
  - an elongated nozzle portion that is tilted with respect to the gravitational direction and connected to the source portion.

2. The apparatus of claim 1, wherein a groove is in a surface of the mask frame opposite to one surface of the mask frame in contact with the mask sheet.

3. The apparatus of claim 2, wherein a plurality of grooves is in the surface opposite to the one surface of the mask frame in contact with the mask sheet, and
- wherein a width of one of the plurality of grooves is different from a width of another one of the plurality of grooves, as measured in one direction.

4. The apparatus of claim 2, wherein a plurality of grooves is in the surface opposite to the one surface of the mask frame in contact with the mask sheet, and
- wherein a depth of one of the plurality of grooves is different from a depth of another one of the plurality of grooves, as measured in one direction.

5. The apparatus of claim 1, further comprising a support unit configured to support one surface of the mask assembly and to support a lower surface of the mask assembly.

6. The apparatus of claim 5, wherein the support unit comprises:
- a supporter having an opening;
- a first support block spaced apart from the supporter and configured to support a rear surface of the mask assembly; and
- a second support block on a lower surface of the supporter and configured to support a side surface of the mask assembly.

7. The apparatus of claim 1, wherein the mask assembly further comprises a support member dividing an opening area of the mask frame into a plurality of opening areas.

8. The apparatus of claim 1, wherein the mask frame has an opening area at a central portion of the mask frame, and
- wherein an inner surface of the opening area is inclined.

9. The apparatus of claim 1, wherein a tilt angle of the mask assembly is in a range of about 3 degrees to about 14 degrees.

10. The apparatus of claim 1, wherein the mask frame has a trapezoidal planar shape.

11. The apparatus of claim 1, wherein a width of a planar shape of the mask frame is smaller at an upper side of the mask frame than at a lower side of the mask frame.

12. The apparatus of claim 1, wherein the mask frame has an opening area having a quadrangular shape at a central portion thereof, and
- wherein a corner portion of the opening area is rounded.

13. A method of manufacturing a display device, the method comprising:
- arranging a mask assembly to be tilted with respect to the gravitational direction;
- arranging one surface of a display substrate on a carrier and one surface of the mask assembly to face each other; and
- depositing a deposition material on the display substrate by passing the deposition material through the mask assembly,
- wherein the mask assembly comprises:
  - a mask frame having a flat surface; and
  - a mask sheet having an end on the flat surface of the mask frame and coupled to the mask frame, and, wherein the deposition material is supplied to an elongated nozzle portion that is arranged to be tilted with respect to gravitational direction.

14. The method of claim 13, wherein a groove is in a surface of the mask frame opposite to one surface of the mask frame in contact with the mask sheet.

15. The method of claim 14, wherein a plurality of grooves is in the surface opposite to the one surface of the mask frame in contact with the mask sheet, and wherein a width of one of the plurality of grooves is different from a width of another one of the plurality of grooves, as measured in one direction.

16. The method of claim 14, wherein a plurality of grooves is in the surface opposite to the one surface of the mask frame in contact with the mask sheet, and wherein a depth of one of the plurality of grooves is different from a depth of another one of the plurality of grooves, as measured in one direction.

17. The method of claim 13, further comprising seating the mask assembly on a support unit, wherein the support unit is configured to support one surface of the mask assembly and to support a lower surface of the mask assembly.

18. The method of claim 17, wherein the support unit comprises:

a supporter having an opening;

a first support block spaced apart from the supporter and configured to support a rear surface of the mask assembly; and a second support block on a lower surface of the supporter and configured to support a side surface of the mask assembly.

19. The method of claim 13, wherein the mask assembly further comprises a support member dividing an opening area of the mask frame into a plurality of opening areas.

20. The method of claim 13, wherein the mask frame has an opening area at a central portion of the mask frame, and wherein an inner surface of the opening area is inclined.

21. The method of claim 13, wherein a tilt angle of the mask assembly is in a range of 3 degrees to 14 degrees.

22. The method of claim 13, wherein the mask frame has a trapezoidal planar shape.

23. The method of claim 13, wherein a width of a planar shape of the mask frame is smaller at an upper side of the mask frame than at a lower side of the mask frame.

24. The method of claim 13, wherein the mask frame has an opening area having a quadrangular shape at a central portion thereof, and wherein a corner portion of the opening area is rounded.

* * * * *